(12) United States Patent
Moy et al.

(10) Patent No.: US 7,578,989 B2
(45) Date of Patent: Aug. 25, 2009

(54) METHOD OF USING CARBIDE AND/OR OXYCARBIDE CONTAINING COMPOSITIONS

(75) Inventors: David Moy, Germantown, MD (US); Chunming Niu, Palo Alto, CA (US); Jun Ma, Lexington, MA (US); Jason M. Willey, Medford, MA (US)

(73) Assignee: Hyperion Catalysis International, Inc., Cambridge, MA (US)

( * ) Notice: Subject to any disclaimer, the term of this patent is extended or adjusted under 35 U.S.C. 154(b) by 293 days.

(21) Appl. No.: 11/743,634

(22) Filed: May 2, 2007

(65) Prior Publication Data

US 2007/0202033 A1  Aug. 30, 2007

Related U.S. Application Data

(63) Continuation of application No. 10/940,242, filed on Sep. 14, 2004, now Pat. No. 7,230,149, which is a continuation of application No. 10/023,618, filed on Dec. 18, 2001, now Pat. No. 6,809,229, which is a continuation-in-part of application No. 09/615,350, filed on Jul. 12, 2000, now abandoned, which is a continuation-in-part of application No. 09/481,184, filed on Jan. 12, 2000, now Pat. No. 6,514,897.

(60) Provisional application No. 60/115,735, filed on Jan. 12, 1999.

(51) Int. Cl.
*C01B 31/34* (2006.01)

(52) U.S. Cl. .................................... 423/440

(58) Field of Classification Search ............ None
See application file for complete search history.

(56) References Cited

U.S. PATENT DOCUMENTS

| | | | |
|---|---|---|---|
| 4,271,041 A | 6/1981 | Boudart et al. |
| 4,663,230 A | 5/1987 | Tennent et al. |
| 4,855,091 A | 8/1989 | Geus |
| 5,110,693 A | 5/1992 | Friend et al. |
| 5,139,987 A | 8/1992 | Ledoux et al. |
| 5,165,909 A | 11/1992 | Tennent et al. |
| 5,171,560 A | 12/1992 | Tennent et al. |
| 5,196,389 A | 3/1993 | Dubots |
| 5,217,930 A | 6/1993 | Dubots |
| 5,308,597 A | 5/1994 | Ledoux et al. |
| 5,384,027 A | 1/1995 | Sherif |
| 5,391,524 A | 2/1995 | Ledoux et al. |
| 5,451,389 A | 9/1995 | Sherif |
| 5,456,897 A | 10/1995 | Moy et al. |
| 5,468,370 A | 11/1995 | Ledoux et al. |
| 5,500,200 A | 3/1996 | Mandeville et al. |
| 5,569,635 A | 10/1996 | Moy et al. |
| 5,576,466 A | 11/1996 | Ledoux et al. |
| 5,618,510 A | 4/1997 | Okada et al. |
| 5,676,918 A | 10/1997 | Okada et al. |
| 5,707,916 A | 1/1998 | Snyder et al. |
| 5,866,434 A | 2/1999 | Massey et al. |
| 5,877,110 A | 3/1999 | Snyder et al. |
| 5,897,945 A | 4/1999 | Lieber et al. |
| 5,965,470 A | 10/1999 | Bening et al. |
| 6,031,711 A | 2/2000 | Tennent et al. |
| 6,090,992 A | 7/2000 | Wu et al. |
| 6,099,965 A | 8/2000 | Tennent et al. |
| 6,110,859 A | 8/2000 | Wu et al. |
| 6,143,689 A | 11/2000 | Moy et al. |
| 6,203,814 B1 | 3/2001 | Fisher et al. |

FOREIGN PATENT DOCUMENTS

| | | |
|---|---|---|
| EP | 0396475 A1 | 11/1990 |
| EP | 0440569 A2 | 8/1991 |
| EP | 0474570 A1 | 3/1992 |
| EP | 0511919 A1 | 11/1992 |
| EP | 0534867 A1 | 3/1993 |
| WO | WO 89/07163 | 8/1989 |
| WO | WO 91/05089 | 4/1991 |
| WO | PCT/US/94/10168 | 9/1994 |
| WO | PCT/US96/09675 | 6/1996 |
| WO | WO 96/41043 | 12/1996 |

OTHER PUBLICATIONS

Iijima, Nature, 354, 56, pp. (1991.
Baker and Harris, Chemistry and Physics of Carbon, Walker and Thrower ed., vol. 14, p. 83, (1978).
C. Pham-Huu, et al., "Reactions of n-Heptane and Methylcyclopentane over an Oxygen-Modified Molybdenum Carbide Catalyst. Study of Coke Formation, Catalyst Deactivation and Regeneration", Ind. Eng. Chem. Res. 34, 1107-1113 (1995).
Golodets, G.I. & Ross, J.R.H., "Heterogeneous Catalytic Reactions Involving Molecular Oxygen", Studies in Surface Science, 15, Elsevier Press, NYC 1983.
Iglesia, E., et al., "Bifunctional Reactions of Alkanes on Tungsten Carbides Modified by Chemisorbed Oxygen", Journal of Catalysis, 131, 523-544 (1991).
Ledoux, M. et al., "Characterization of a Catalytically Active Molybdenum Oxycarbide", Mat. Res. Soc. Symp Proc., vol. 368, 57-67 (1995).
McCarthy and Bening (Polymer Preprints ACS Div. Of Polymer Chem., 30(1) 420 (1990).
Oberlin, A. and Endo, M., J. of Crystal Growth, vol. 32 (1976), pp. 335-349.

(Continued)

*Primary Examiner*—Melvin C Mayes
*Assistant Examiner*—Stefanie Cohen
(74) *Attorney, Agent, or Firm*—Kramer Levin Naftalis & Frankel LLP; Barry Evans, Esq.

(57) ABSTRACT

Compositions including carbide-containing nanorods and/or oxycarbide-containing nanorods and/or carbon nanotubes bearing carbides and oxycarbides and methods of making the same are provided. Rigid porous structures including oxycarbide-containing nanorods and/or carbide containing nanorods and/or carbon nanotubes bearing carbides and oxycarbides and methods of making the same are also provided. The compositions and rigid porous structures of the invention can be used either as catalyst and/or catalyst supports in fluid phase catalytic chemical reactions. Processes for making supported catalyst for selected fluid phase catalytic reactions are also provided.

1 Claim, 6 Drawing Sheets

OTHER PUBLICATIONS

Ribeiro, F. et al., "Reactions of Neopentane, Methylcyclohexane, and 3,3-Dimethylpentane on Tungsten Carbides: The Effect of Surface Oxygen on Reaction Pathways", Journal of Catalysis, 130, 86-105 (1991).

Ribeiro, F. et al, "Catalytic Reactions of n-Alkanes on β-W2C and WC: The Effect of Surface Oxygen on Reaction Pathways", Journal of Catalysis, 130, 498-513 (1991).

Rodriguez, N., J. Mater. Research, vol. 8, p. 3233 (1993).

Ledoux, M., et al., "New Synthesis and Uses of High-Specific-Surface SiC as a Catalytic Support that is Chemically Inert and Has High Thermal Resistance", Journal of Catalysis, 114, 176-185 (1988).

Pham-Huu, C., et al., "Reactions of 2- and 3-Methylpentane, Methylcyclopentance, Cyclopentane, and Cyclohexane on Activated Mo2C", Journal of Catalysis, 143, 249-261 (1993).

Weaver, Science, 165 (1994).

FIG. 1A  XRD and SEM of CARBON NANORODS

XRD, Sample 12

Reference XRD Pattern, hexagonal $Mo_2C$

SEM Micrograph, Sample 12

FIG. 2A XRD and HRTEM of CARBIDE NANORODS
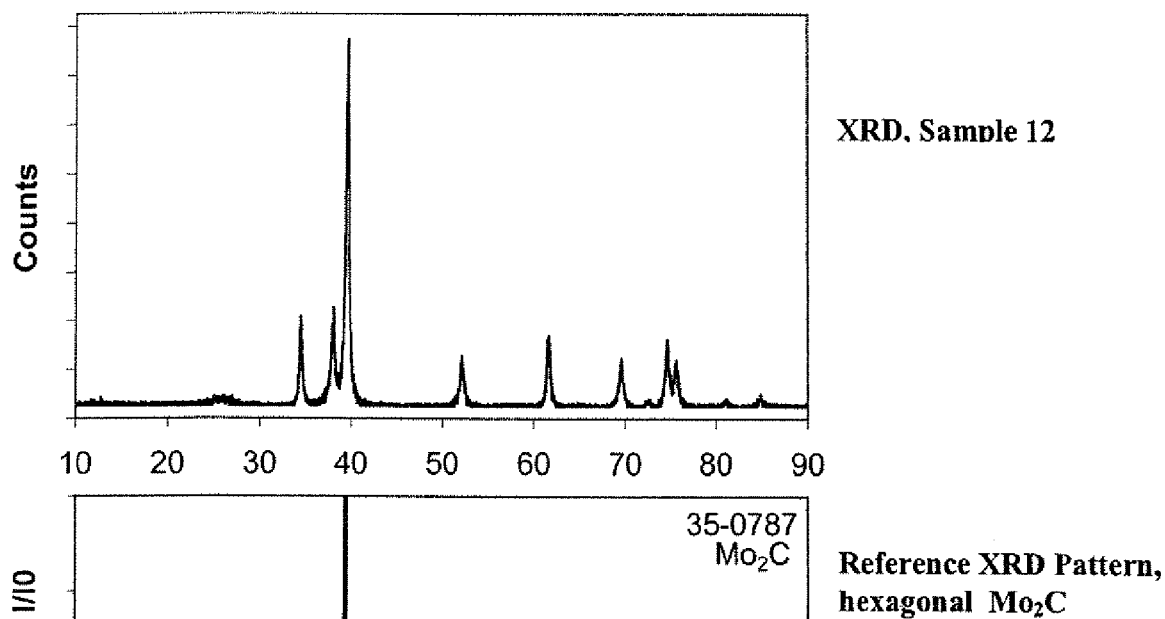
XRD, Sample 12
Reference XRD Pattern, hexagonal $Mo_2C$
HRTEM Micrograph. Sample 12
FIG. 2B

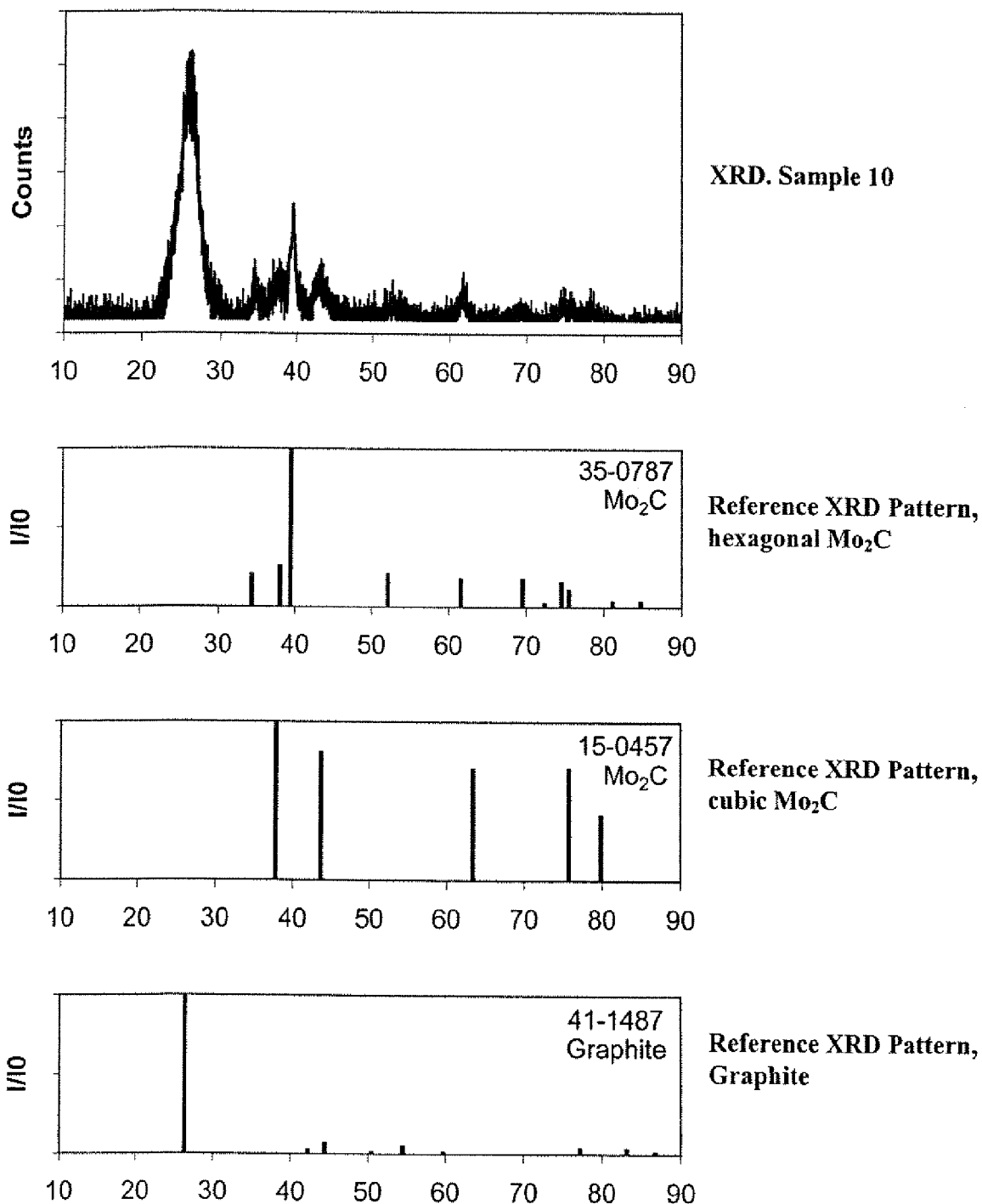
FIG. 3A XRD and HRTEM of CARBIDE NANOPARTICLES SUPPORTED ON CARBON NANOTUBES

HRTEM Micrograph. Sample 10

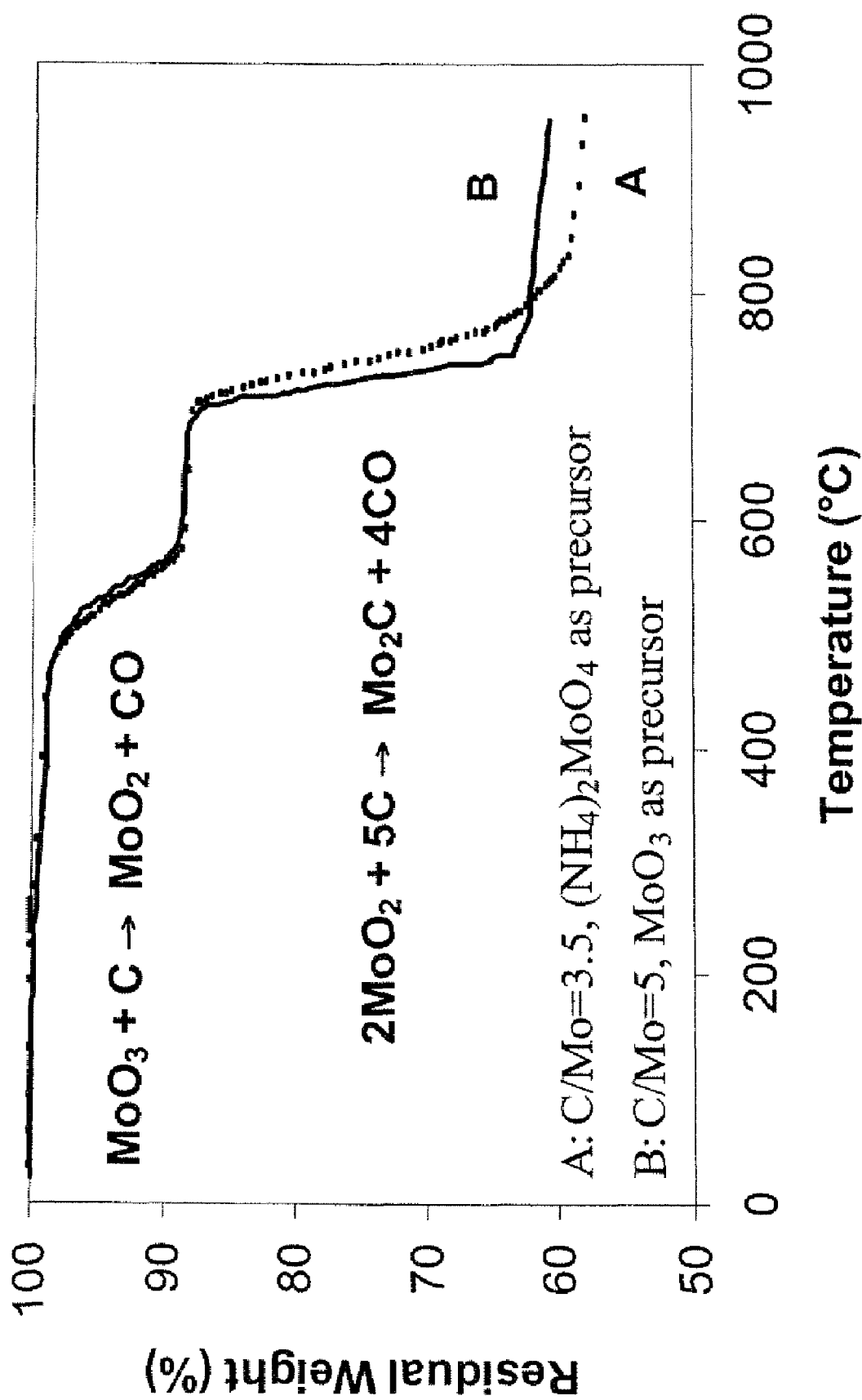
FIG. 4 Calcination of C/Mo Precursors

SEM Micrographs of SiC Nanorods

METHOD OF USING CARBIDE AND/OR OXYCARBIDE CONTAINING COMPOSITIONS

RELATED APPLICATIONS

This application is a continuation of U.S. application Ser. No. 10/940,242, filed Sep. 14, 2004, now U.S. Pat. No. 7,230,149, which is a continuation of U.S. application Ser. No. 10/023,618 filed Dec. 18, 2001, now U.S. Pat. No. 6,809,229 which is a continuation-in-part of U.S. application Ser. No. 09/615,350 filed Jul. 12, 2000, now abandoned, which is a continuation-in-part of U.S. application Ser. No. 09/481,184 filed Jan. 12, 2000, now U.S. Pat. No. 6,514,897, which claims benefit to and is based on U.S. Provisional Patent Application No. 60/115,735 filed Jan. 12, 1999, which applications are all hereby incorporated by reference in their entirety.

BACKGROUND OF THE INVENTION

1. Field of the Invention

The invention relates to compositions of carbide-containing and oxycarbide-containing nanorods, carbon nanotubes including carbide and/or oxycarbide compounds, rigid porous structures including these compositions, and methods of making and using the same. More specifically, the invention relates to rigid three dimensional structures comprising carbide and/or oxycarbide-containing nanorods or carbon nanotubes bearing carbides and oxycarbides, having high surface areas and porosities, low bulk densities, substantially no micropores and increased crush strengths. The invention also relates to using the compositions and the rigid porous structures including these compositions as catalysts and catalyst supports, in heterogeneous catalytic reactions frequently encountered in petrochemical and refining processes.

2. Description of the Related Art

Heterogeneous catalytic reactions are widely used in chemical processes in the petroleum, petrochemical and chemical industries. Such reactions are commonly performed with the reactant(s) and product(s) in the fluid phase and the catalyst in the solid phase. In heterogeneous catalytic reactions, the reaction occurs at the interface between the phases, i.e., the interface between the fluid phase of the reactant(s) and product(s) and the solid phase of the supported catalyst. Hence, the properties of the surface of a heterogeneous supported catalyst are important factors in the effective use of the catalyst. Specifically, the surface area of the active catalyst, as supported, and the accessibility of that surface area to reactant adsorption and product desorption are important. These factors affect the activity of the catalyst, i.e., the rate of conversion of reactants to products. The chemical purity of the catalyst and the catalyst support have an important effect on the selectivity of the catalyst, i.e., the degree to which the catalyst produces one product from among several products and the life of the catalyst.

Generally catalytic activity is proportional to catalyst surface area. Therefore, a high specific area is desirable. However, the surface area should be accessible to reactants and products as well as to heat flow. The chemisorption of a reactant by a catalyst surface is preceded by the diffusion of that reactant through the internal structure of the catalyst.

Since the active catalyst compounds are often supported on the internal structure of a support, the accessibility of the internal structure of a support material to reactant(s), product(s) and heat flow is important. Accessibility is measured by porosity and pore size distribution. Activated carbons and charcoals used as catalyst supports may have surface areas of about a thousand square meters per gram and porosities of less than 1 ml/gm. However, much of this surface area and porosity, as much as 50%, and often more, is associated with micropores, i.e., pores with pore diameters of 2 nm or less. These pores can be inaccessible because of diffusion limitations. They are easily plugged and thereby deactivated. Thus, high porosity material where the pores are mainly in the mesopore region, i.e., greater than 2 nm or macropore region, i.e., greater than 50 nm, ranges are most desirable.

It is also important that self-supported catalysts and supported catalysts not fracture or attrit during use because such fragments may become entrained in the reaction stream and must then be separated from the reaction mixture. The cost of replacing attritted catalyst, the cost of separating it from the reaction mixture and the risk of contaminating the product are all burdens upon the process. In slurry phase, e.g. where the solid supported catalyst is filtered from the process stream and recycled to the reaction zone, the fines may plug the filters and disrupt the process. It is also important that a catalyst, at the very least, minimize its contribution to the chemical contamination of reactant(s) and product(s). In the case of a catalyst support, this is even more important since the support is a potential source of contamination both to the catalyst it supports and to the chemical process. Further, some catalysts are particularly sensitive to contamination that can either promote unwanted competing reactions, i.e., affect its selectivity, or render the catalyst ineffective, i.e., "poison" it. For example, charcoal and commercial graphites or carbons made from petroleum residues usually contain trace amounts of sulfur or nitrogen as well as metals common to biological systems and may be undesirable for that reason.

Since the 1970s carbon nanofibers or nanotubes have been identified as materials of interest for use as catalysts and catalyst supports. Carbon nanotubes exist in a variety of forms and have been prepared through the catalytic decomposition of various carbon-containing gases at metal surfaces. Nanofibers such as fibrils, bucky tubes and nanotubes are distinguishable from continuous carbon fibers commercially available as reinforcement materials. In contrast to nanofibers, which have, desirably large, but unavoidably finite aspect ratios, continuous carbon fibers have aspect ratios (L/D) of at least $10^4$ and often $10^6$ or more. The diameter of continuous fibers is also far larger than that of nanofibers, being always greater than 1 μm and typically 5 μm to 7 μm.

U.S. Pat. No. 5,576,466 to Ledoux et al. discloses a process for isomerizing straight chain hydrocarbons having at least 7 carbon atoms using catalysts which include molybdenum compounds whose active surface consists of molybdenum carbide which is partially oxidized to form one or more oxycarbides. Ledoux et al. disclose several ways of obtaining an oxycarbide phase on molybdenum carbide. These methods require the formation of molybdenum carbides by reacting gaseous compounds of molybdenum metal with charcoal at temperatures between 900° C. and 1400° C. These are energy intensive processes. Moreover, the resulting molybdenum carbides have many drawbacks similar to catalysts prepared with charcoal. For example, much of the surface area and porosity of the catalysts is associated with micropores and as such these catalysts are easily plugged and thereby deactivated.

While activated charcoals and other materials have been used as catalysts and catalyst supports, none have heretofore had all of the requisite qualities of high surface area, porosity, pore size distribution, resistance to attrition and purity for the conduct of a variety of selected petrochemical and refining processes. Although many of these materials have high surface area, much of the surface area is in the form of inaccessible micropores.

It would therefore be desirable to provide a family of carbide-containing and oxycarbide containing catalysts that have highly accessible surface area, high porosity, and attrition resistance, and which are substantially micropore free, highly active, highly selective and are capable of extended use with no significant deactivation.

Nanofiber mats, assemblages and aggregates have been previously produced to take advantage of the increased surface area per gram achieved using extremely thin diameter fibers. These structures are typically composed of a plurality of intertwined or intermeshed nanotubes.

OBJECTS OF THE INVENTION

It is an object of the present invention to provide a composition including a multiplicity of oxycarbide nanorods having predominately diameters between 2.0 nm and 100 nm.

It is a further object of the present invention to provide another composition including a multiplicity of carbide nanorods comprising oxycarbides.

It is a further object of the present invention to provide another composition including a multiplicity of carbon nanotubes which have predominantly diameters between 2.0 nm and 100 nm, which nanotubes comprise carbides and optionally also oxycarbides.

It is a further object of the present invention to provide another composition including a multiplicity of carbon nanotubes having a carbide portion and optionally an oxycarbide portion.

It is a further object of the present invention to provide rigid porous structures which comprise compositions including a multiplicity of oxycarbide nanorods or a multiplicity of carbide nanorods with or without oxycarbides.

It is a further object of the present invention to provide compositions of matter which comprise three-dimensional rigid porous structures including oxycarbide nanorods, carbide nanorods, carbide nanorods comprising oxycarbides, or carbon nanotubes comprising a carbide portion and optionally an oxycarbide portion.

It is a further object of the present invention to provide methods for the preparation of and using the rigid porous structures described above.

It is still a further object of the invention to provide improved catalysts, catalyst supports and other compositions of industrial value based on composition including a multiplicity of carbide nanorods, oxycarbide nanorods and/or carbon nanotubes comprising carbides and oxycarbides.

It is still a further object of the invention to provide improved catalysts, catalyst supports and other compositions of industrial value based on three-dimensional rigid carbide and/or oxycarbide porous structures of the invention.

It is an object of the invention to provide improved catalytic systems, improved catalyst supports and supported catalysts for heterogeneous catalytic reactions for use in chemical processes in the petroleum, petrochemical and chemical industries.

It is a further object of the invention to provide improved methods for preparing catalytic systems and supported catalysts.

It is another object of the invention to improve the economics and reliability of making and using catalytic systems and supported catalysts.

It is still a further object of the invention to provide improved, substantially pure, rigid carbide catalyst support of high porosity, activity, selectivity, purity and resistance to attrition.

The foregoing and other objects and advantages of the invention will be set forth in or will be apparent from the following description and drawings.

SUMMARY OF THE INVENTION

The present invention is in compositions comprising carbide nanorods which contain oxycarbides. Another composition of the present invention comprises carbide-containing nanorods which also contain oxycarbides. Another composition comprises carbon nanotubes which bear carbides and/or oxycarbides on the surfaces thereof. In one composition the carbides retain the structure of the original aggregates of carbon nanotubes. Compositions are also provided which include carbide-containing nanorods where the morphology of the aggregates of carbon nanotubes is not retained. The invention also provides a composition of carbides supported on carbon nanotubes where a portion of the carbon nanotubes have been converted to carbide-containing nanorods and/or carbides.

The present invention also provides rigid porous structures including oxycarbide nanorods and/or carbide-containing nanorods and/or carbon nanotubes bearing carbides and oxycarbides. Depending on the morphology of the carbon nanotubes used as a source of carbon, the rigid porous structures can have a uniform or non-uniform pore distribution. Extrudates of oxycarbide nanorods and/or carbide-containing nanorods and/or carbon nanotubes bearing oxycarbides and/or carbides are also provided. The extrudates of the present invention are glued together to form a rigid porous structure.

The compositions and rigid porous structures of the invention can be used either as catalysts and/or catalyst supports in fluid phase catalytic chemical reactions.

The present invention also provides methods of making oxycarbide-containing nanorods, carbide-containing nanorods bearing oxycarbides and carbon-nanotubes bearing carbides and oxycarbides. Methods of making rigid porous structures are also provided. Rigid porous structures of carbide-nanorods can be formed by treating rigid porous structures of carbon nanotubes with a Q-containing compound, i.e., a compound containing a transition metal, a rare earth or an actinide. Depending upon conditions the conversion of the carbon nanotubes to carbide-containing nanorods can be complete or partial. The rigid porous structure of carbide nanorods and/or carbon nanotubes can be further treated with an oxidizing agent to form oxycarbide nanorods and/or oxycarbides. The rigid porous structures of the invention can also be prepared from loose nanorods or aggregates of carbide-containing nanorods and/or oxycarbide-containing nanorods by initially forming a suspension in a medium, separating the suspension from the medium, and pyrolyzing the suspension to form rigid porous structures. The present invention also provides a process for making supported catalysts for selected fluid phase reactions.

Other improvements which the present invention provides over the prior art will be identified as a result of the following description which sets forth the preferred embodiments of the present invention. The description is not in any way intended to limit the scope of the present invention, but rather only to provide a working example of the present preferred embodiments. The scope of the present invention will be pointed out in the appended claims.

BRIEF DESCRIPTION OF THE DRAWINGS

The accompanying drawings, which are incorporated in and constitute a part of the specification, illustrate an exemplary embodiment of the present invention.

FIG. 1A is an XRD graph of sample 12 as set forth in Table 1. A reference XRD pattern of hexagonal $Mo_2C$ is shown immediately below.

FIG. 2A is an XRD graph of sample 12 as set forth in Table 1. A reference XRD pattern of hexagonal $Mo_2C$ is also shown immediately below.

FIG. 2B is an HRTEM micrograph of sample 12 as set forth in Table 1.

FIG. 3A is an XRD graph of sample 10 as set forth in Table 1. Reference XRD patterns of hexagonal $Mo_2C$, cubic $Mo_2C$ and graphite are shown immediately below.

FIG. 4 is a thermogravimetric analysis of sample 12 as set forth in Table 1.

DETAILED DESCRIPTION OF THE INVENTION

Figure 1B:
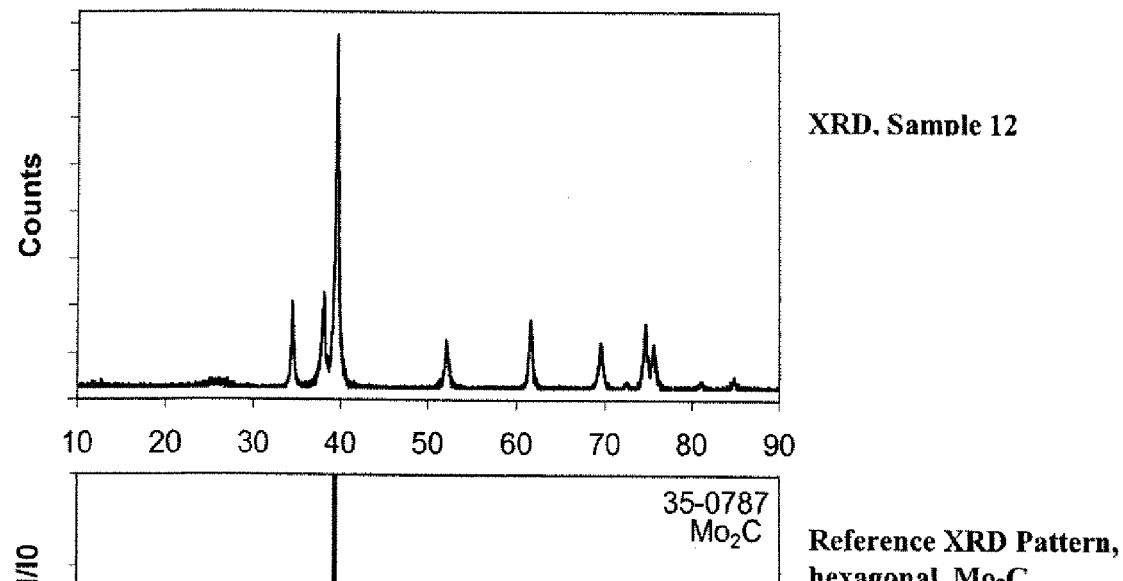
FIGS. 1B and 1C are SEM micrographs of sample 12 as set forth in Table 1.

Patents, patent applications, and patent publications are referred to herein are incorporated by reference in their entirety.

DEFINITIONS

"Aggregate" refers to a dense, microscopic particulate structure. More specifically, the term "assemblage" refers to structures having relatively or substantially uniform physical properties along at least one dimensional axis and desirably having relatively or substantially uniform physical properties in one or more planes within the assemblage, i.e. they have isotropic physical properties in that plane. The assemblage may comprise uniformly dispersed individual interconnected nanotubes or a mass of connected aggregates of nanotubes. In other embodiments, the entire assemblage is relatively or substantially isotropic with respect to one or more of its physical properties. The physical properties which can be easily measured and by which uniformity or isotropy are determined include resistivity and optical density.

"Bimodal pore structure" refers to a specific pore structure occurring when aggregate particles of nanotubes and/or nanorods are bonded together. The resulting structure has a two-tiered architecture comprising a macrostructure of nanotube aggregates having macropores among the bundles of nanotube aggregates and a microstructure of intertwined nanotubes having a pore structure within each individual bundle of aggregate particles.

"Carbides" refers to compounds of composition QC or $Q_2C$. The term also includes crystalline structures characterized by x-ray diffraction ("XRD") as QC or $Q_2C$ by themselves and/or in combinations with Q or C, e.g., compounds remaining after the synthesis step is substantially complete. Carbides can be detected and characterized by XRD. When, as is contemplated within the scope of this invention, the carbides are prepared by carburization of metal oxides or by oxidation of elemental carbon, a certain amount of "non-stoichiometric" carbide may appear, but the diffraction pattern of the true carbides will still be present. Metal rich non-stoichiometric carbides, such as might be formed from a synthesis wherein the metal is carburized, are missing a few of the carbons that the metal matrix can accommodate. Carbon rich non-stoichiometric carbides comprise domains of stoichiometric carbides embedded in the original carbon structure. Once the carbide crystallites are large enough they can be detected by XRD.

Carbides also refers to interstitial carbides as more specifically defined in *Structural Inorganic Chemistry*, by A. F. Wells, 4th Ed., Clarendon Press, Oxford 1975 and in *The Chemistry of Transition Metal Carbides and Nitrides*, edited by S. T. Oyama, 1st Ed., a Blackie Academic & Professional publication 1996. Both books are hereby incorporated by reference in their entirety.

"Carbide-containing nanorod" refers to a Q-containing nanorod predominantly having a diameter greater than 2 nm but less than 100 nm, for example greater than 5 nm but less than 50 nm, and having an aspect ratio from 5 to 500. When the carbide nanorod has been made by conversion of the carbon of a nanotube to carbide compounds then the conversion has been substantially complete.

"Fluid phase reaction" refers to any liquid or gas phase catalytic reactions such as hydrogenation, protonation, oxidation, hydrodesulfurisation, hydrodenitrogenation, hydrodemetallisation, hydrodeoxygenation, protonation, hydrodearomatization, dehydrogenation, hydrogenolysis, isomerization, alkylation, dealkylation, and transalkylation.

"Graphenic" carbon is a form of carbon whose carbon atoms are each linked to three other carbon atoms in an essentially planar layer forming hexagonal fused rings. The layers are platelets having only a few rings in their diameter or ribbons having many rings in their length but only a few rings in their width.

"Graphenic analogue" refers to a structure which is incorporated in a graphenic surface.

"Graphitic" carbon consists of layers which are essentially parallel to one another and no more than 3.6 angstroms apart.

"Internal structure" refers to the internal structure of an assemblage including the relative orientation of the fibers, the diversity of and overall average of nanotube orientations, the proximity of the nanotubes to one another, the void space or pores created by the interstices and spaces between the fibers and size, shape, number and orientation of the flow channels or paths formed by the connection of the void spaces and/or pores. According to another embodiment, the structure may also include characteristics relating to the size, spacing and orientation of aggregate particles that form the assemblage. The term "relative orientation" refers to the orientation of an individual nanotube or aggregate with respect to the others (i.e., aligned versus non-aligned). The "diversity of" and "overall average" of nanotube or aggregate orientations refers to the range of nanotube orientations within the structure (alignment and orientation with respect to the external surface of the structure).

"Isotropic" means that all measurements of a physical property within a plane or volume of the structure, independent of the direction of the measurement, are of a constant value. It is understood that measurements of such non-solid compositions must be taken on a representative sample of the structure so that the average value of the void spaces is taken into account.

"Macropore" refers to a pore which has a diameter of greater than or equal to 50 nm.

"Mesopore" refers to a pore which has a diameter of greater than or equal to 2 nm but less than 50 nm.

"Micropore" refers to a pore which has a diameter of less than 2 nm.

"Nanorod" refers to a rod-like structure having a surface and a substantially solid core with a diameter of at least 1 nm but less than 100 nm. The structure has an aspect ratio between 10 and 500 and a length up to 50 µm. The diameter of a nanorod is substantially uniform along the entire length of the nanorod. A nanorod is solid not hollow.

"Nanostructure" refers to nanotubes, nanorods, and any combinations or mixtures of nanotubes and nanorods.

"Nanotube", "nanofiber" and "fibril" are used interchangeably. Each refers to an elongated hollow structure having a diameter less than 1 µm. The term "nanotube" also includes "bucky tubes" and graphitic nanofibers in which the graphene planes are oriented in herring bone pattern.

"Nonuniform pore structure" refers to a pore structure occurring when individual discrete nanotubes are distributed in a substantially nonuniform manner with substantially nonuniform spacings between nanotubes.

Oxycarbides, unlike carbides, are inherently non-stoichiometric. They are any structure containing oxygen predominantly on the surface and derived from a carbide. For example, the oxycarbides of the present invention can have the formula:

$$Q_n C_{x-y} O_y$$

wherein Q is as defined above; n and x are selected to satisfy a known stoichiometry of a carbide of Q; y is less than x and the ratio [y/(x−y)] is at least 0.02 and less than 0.9 and more preferably is between 0.05 and 0.50. Furthermore, the term "oxycarbides" also includes, but is not limited to, products formed by oxidative treatments of carbides present in carbon nanotubes used as a source of carbon or in connection with carbide nanorods as a source of carbides. Oxycarbides can also include products formed by carburization of metal oxides. Oxycarbides also comprise mixtures of unreacted carbides and oxides, chemisorbed and physisorbed oxygen. More specifically, oxycarbides have a total amount of oxygen sufficient to provide at least 25% of at least one monolayer of absorbed oxygen as determined by temperature programmed desorption (TPD) containing on the carbide content of the carbide source. Oxycarbides also refer to compounds of the same name as defined in *The Chemistry of Transition Metal Carbides and Nitrides*, edited by S. T. Oyama, a Blackie Academic & Professional Publication. Examples of oxycarbides include polycrystalline compounds, wherein Q is a metal preferably in two valent states. Q can be bonded to another metal atom or only to an oxygen or only to a carbon atom. However, Q is not bonded to both oxygen and carbon atoms. The term "carbides" encompasses both carbides and oxycarbides.

"Oxycarbides-containing nanorod" refers to an Q-containing nanorod having the formula $Q_n C_{x-y} O_y$ as defined above, having an aspect ratio of 5 to 500.

"Physical property" means an inherent, measurable property of the porous structure, e.g., surface area, resistivity, fluid flow characteristics, density, porosity, etc.

"Pore" traditionally refers to an opening or depression in the surface of a catalyst or catalyst support. Catalysts and catalyst supports comprising carbon nanotubes lack such traditional pores. Rather, in these materials, the spaces between individual nanotubes behave as pores, and the equivalent pore size of nanotube aggregates can be measured by conventional methods (porosimetry) of measuring pore size and pore size distribution. By varying the density and structure of aggregates, the equivalent pore size and pore size distribution can be varied.

"Q" represents an element selected from the group consisting of transition metals (groups IIIB, IVB, VB, VIB, VIIB, and VIII of periods 4, 5, and 6 of the Periodic Table), rare earths (lanthanides) and actinides. Q can also be boron, silicon or aluminum More preferably, Q is selected from the group consisting of Ti, Ta, Nb, Zr, Hf, Mo, V, B, Si, Al and W.

"Q-containing" refers to a compound or composition modified reaction with Q as defined above.

"Relatively" means that 95% of the values of the physical property when measured along an axis of, or within a plane of or within a volume of the structure, as the case may be, will be within plus or minus 20% of a mean value.

"Substantially" or "predominantly" mean that 95% of the values of the physical property when measured along an axis of, or within a plane of or within a volume of the structure, as the case may be, will be within plus or minus 10% of a mean value.

"Surface area" refers to the total surface area of a substance measurable by the BET technique as known in the art, a physisorption technique. Nitrogen or helium can be use absorbents to measure the surface area.

"Uniform pore structure" refers to a pore structure occurring when individual discrete nanotubes or nanofibers form the structure. In these cases, the distribution of individual nanotubes in the particles is substantially uniform with substantially regular spacings between the nanotubes. These spacings (analogous to pores in conventional supports) vary according to the densities of the structures.

Carbon Nanotubes

The term nanotubes refers to various carbon tubes or fibers having very small diameters including fibrils, whiskers, buckytubes, etc. Such structures provide significant surface area when assembled into a structure because of their size and shape. Moreover, such nanotubes can be made with high purity and uniformity.

Preferably, the nanotube used in the present invention have a diameter less than 1 µm, preferably less than about 0.5 µm, and even more preferably less than 0.1 µm and most preferably less than 0.05 µm.

Carbon nanotubes can be made having diameters in the range of 3.5 to 70 nm.

The nanotubes, buckytubes, fibrils and whiskers that are referred to in this application are distinguishable from continuous carbon fibers commercially available as reinforcement materials. In contrast to nanofibers, which have desirably large, but unavoidably finite aspect ratios, continuous carbon fibers have aspect ratios (L/D) of at least $10^4$ and often $10^6$ or more. The diameter of continuous fibers is also far larger than that of fibrils, being always greater than 1 µm and typically 5 to 7 µm.

Continuous carbon fibers are made by the pyrolysis of organic precursor fibers, usually rayon, polyacrylonitrile ("PAN") and pitch. Thus, they may include heteroatoms within their structure. The graphitic nature of "as made" continuous carbon fibers varies, but they may be subjected to a subsequent graphitization step. Differences in degree of graphitization, orientation and crystallinity of graphite planes, if they are present, the potential presence of heteroatoms and even the absolute difference in substrate diameter make experience with continuous fibers poor predictors of nanofiber chemistry.

Carbon nanotubes exist in a variety of forms and have been prepared through the catalytic decomposition of various carbon-containing gases at metal surfaces.

U.S. Pat. No. 4,663,230 to Tennent hereby incorporated by reference, describes carbon nanotubes that are free of a continuous thermal carbon overcoat and have multiple ordered graphitic outer layers that are substantially parallel to the nanotube axis. As such they may be characterized as having their c-axes, the axes which are perpendicular to the tangents of the curved layers of graphite, substantially perpendicular to their cylindrical axes. They generally have diameters no greater than 0.1 μm and length to diameter ratios of at least 5. Desirably they are substantially free of a continuous thermal carbon overcoat, i.e., pyrolytically deposited carbon resulting from thermal cracking of the gas feed used to prepare them. Tennent describes nanotubes typically 3.5 to 70 nm having an ordered, "as grown" graphitic surface.

U.S. Pat. No. 5,171,560 to Tennent et al., hereby incorporated by reference, describes carbon nanotubes free of thermal overcoat and having graphitic layers substantially parallel to the nanotube axes such that the projection of the layers on the nanotube axes extends for a distance of at least two nanotube diameters. Typically, such nanotubes are substantially cylindrical, graphitic nanotubes of substantially constant diameter and comprise cylindrical graphitic sheets whose c-axes are substantially perpendicular to their cylindrical axis. They are substantially free of pyrolytically deposited carbon, have a diameter less than 0.1 μm and a length to diameter ratio of greater than 5. These fibrils are of primary interest in the invention.

When the projection of the graphitic layers on the nanotube axis extends for a distance of less than two nanotube diameters, the carbon planes of the graphitic nanotube, in cross section, take on a herring bone appearance. These are termed fishbone fibrils. U.S. Pat. No. 4,855,091 to Geus, hereby incorporated by reference, provides a procedure for preparation of fishbone fibrils substantially free of a pyrolytic overcoat. These carbon nanotubes are also useful in the practice of the invention. See also, U.S. Pat. No. 5,165,909 to Tennent, hereby incorporated by reference.

Oxidized nanofibers are used to form rigid porous assemblages. U.S. Pat. No. 5,965,470, hereby incorporated by reference, describes processes for oxidizing the surface of carbon nanotubes that include contacting the nanotubes with an oxidizing agent that includes sulfuric acid ($H_2SO_4$) and potassium chlorate ($KClO_3$) under reaction conditions (e.g., time, temperature, and pressure) sufficient to oxidize the surface of the fibril. The nanotubes oxidized according to the processes of McCarthy, et al. are non-uniformly oxidized, that is, the carbon atoms are substituted with a mixture of carboxyl, aldehyde, ketone, phenolic and other carbonyl groups.

Nanotubes have also been oxidized nonuniformly by treatment with nitric acid. International Application WO95/07316 discloses the formation of oxidized fibrils containing a mixture of functional groups. Hoogenvaad, M. S., et al. (*Metal Catalysts Supported on a Novel Carbon Support*, Presented at Sixth International Conference on Scientific Basis for the Preparation of Heterogeneous Catalysts, Brussels, Belgium, September 1994) also found it beneficial in the preparation of nanotube-supported precious metals to first oxidize the nanotube surface with nitric acid. Such pretreatment with acid is a standard step in the preparation of carbon-supported noble metal catalysts, where, given the usual sources of such carbon, it serves as much to clean the surface of undesirable materials as to functionalize it.

In published work, McCarthy and Bening (Polymer Preprints ACS Div. of Polymer Chem. 30 (1)420(1990)) prepared derivatives of oxidized nanotubes in order to demonstrate that the surface comprised a variety of oxidized groups. The compounds they prepared, phenylhydrazones, haloaromaticesters, thallous salts, etc., were selected because of their analytical utility, being, for example, brightly colored, or exhibiting some other strong and easily identified and differentiated signal.

Nanotubes may be oxidized using hydrogen peroxide, chlorate, nitric acid and other suitable reagents. See, for example, U.S. patent application Ser. No. 09/861,370 filed May 18, 2001 entitled "Modification of Carbon Nanotubes by Oxidation with Peroxygen Compounds" and U.S. patent application Ser. No. 09/358,745, filed Jul. 21, 1999, entitled "Methods of Oxidizing Multiwalled Carbon Nanotubes."

The nanotubes within the structure may be further functionalized as described in U.S. Pat. No. 6,203,814 to Fischer.

Carbon nanotubes of a morphology similar to the catalytically grown fibrils or nanotubes described above have been grown in a high temperature carbon arc (Iijima, Nature 354 56 1991, hereby incorporated by reference). It is now generally accepted (Weaver, Science 265 1994, hereby incorporated by reference) that these arc-grown nanofibers have the same morphology as the earlier catalytically grown fibrils of Tennent. Arc grown carbon nanofibers are also useful in the invention.

Nanotube Aggregates and Assemblages

The "unbonded" precursor nanotubes may be in the form of discrete nanotubes, aggregates of nanotubes or both.

As with all nanoparticles, nanotubes aggregate in several stages or degrees. Catalytically grown nanotubes produced according to U.S. Pat. No. 6,031,711 are formed in aggregates substantially all of which will pass through a 700 μm sieve. About 50% by weight of the aggregates pass through a 300 μm sieve. The size of as-made aggregates can, of course, be reduced by various means.

These aggregates have various morphologies (as determined by scanning electron microscopy) in which they are randomly entangled with each other to form entangled balls of nanotubes resembling bird nests ("BN"); or as aggregates consisting of bundles of straight to slightly bent or kinked carbon nanotubes having substantially the same relative orientation, and having the appearance of combed yarn ("CY")—e.g., the longitudinal axis of each nanotube (despite individual bends or kinks) extends in the same direction as that of the surrounding nanotubes in the bundles; or, as, aggregates consisting of straight to slightly bent or kinked nanotubes which are loosely entangled with each other to form an "open net" ("ON") structure. In open net structures the extent of nanotube entanglement is greater than observed in the combed yarn aggregates (in which the individual nanotubes have substantially the same relative orientation) but less than that of bird nest. CY and ON aggregates are more readily dispersed than BN.

When carbon nanotubes are used, the aggregates, when present, are generally of the bird's nest, combed yarn or open net morphologies. The more "entangled" the aggregates are, the more processing will be required to achieve a suitable composition if a high porosity is desired. This means that the selection of combed yarn or open net aggregates is most preferable for the majority of applications. However, bird's nest aggregates will generally suffice.

The morphology of the aggregate is controlled by the choice of catalyst support. Spherical supports grow nanotubes in all directions leading to the formation of bird nest aggregates. Combed yarn and open nest aggregates are prepared using supports having one or more readily cleavable planar surfaces. U.S. Pat. No. 6,143,689 hereby incorporated by reference, describes nanotubes prepared as aggregates having various morphologies.

Further details regarding the formation of carbon nanotube or nanofiber aggregates may be found in the disclosures of U.S. Pat. No. 5,165,909; U.S. Pat. No. 5,456,897; U.S. Pat. No. 5,707,916; U.S. Pat. No. 5,877,110; PCT Application No. US89/00322, filed Jan. 28, 1989 ("Carbon Fibrils") WO 89/07163, and Moy et al., U.S. Pat. No. 5,110,693, U.S. patent application Ser. No. 447,501 filed May 23, 1995; U.S. patent application Ser. No. 456,659 filed Jun. 2, 1995; PCT Application No. US90/05498, filed Sep. 27, 1990 ("Fibril Aggregates and Method of Making Same") WO 91/05089, and U.S. Pat. No. 5,500,200; U.S. application Ser. No. 08/329,774 by Bening et al., filed Oct. 27, 1984; and U.S. Pat. No. 5,569,635, all of which are assigned to the same assignee as the invention here and of which are hereby incorporated by reference.

Nanotube mats or assemblages have been prepared by dispersing nanofibers in aqueous or organic media and then filtering the nanofibers to form a mat or assemblage. The mats have also been prepared by forming a gel or paste of nanotubes in a fluid, e.g. an organic solvent such as propane and then heating the gel or paste to a temperature above the critical temperature of the medium, removing the supercritical fluid and finally removing the resultant porous mat or plug from the vessel in which the process has been carried out. See, U.S. Pat. No. 5,691,054.

Extrudates of Carbon Nanotubes

In a preferred embodiment the carbon rigid porous structures comprise extrudates of carbon nanotubes. Aggregates of carbon nanotubes treated with a gluing agent or binder are extruded by conventional extrusion methods into extrudates which are pyrolyzed or carbonized to form rigid carbon structures. If the bundles of carbon nanotubes are substantially intact except that they have been splayed (e.g. by sonication) or partially unraveled, the structure provides a bimodal pore structure. The space between bundles ranges from points of contact to about 1 µm. Within bundles, spaces between carbon nanotubes range from 10 to 30 nm. The resulting rigid bimodal porous structure is substantially free of micropores, has surface areas ranging from about 250 $m^2$/gm to about 400 $m^2$/gm and a crush strength of about 20 psi for extrudates of ⅛ inch in diameter. Carbon nanotube extrudates have densities ranging from about 0.5 gm/$cm^3$ to about 0.7 gm/$cm^3$, which can be controlled by the density of the extrusion paste. The extrudates have liquid absorption volumes from about 0.7 $cm^3$/gm.

Gluing or binding agents are used to form the paste of carbon nanotubes required for extrusion processes. Useful gluing or binding agents include, without limitation, cellulose, carbohydrates, polyethylene, polystyrene, nylon, polyurethane, polyester, polyamides, poly(dimethylsiloxane), phenolic resins and the like.

The extrudates obtained as described above can be further treated with mild oxidizing agents such as hydrogen peroxide without affecting the integrity of the rigid porous carbon structures. Subsequently, the rigid porous structures can be impregnated with catalytic particles by ion exchange, generally a preferred method for deposition of small size particles.

Alternatively, the rigid porous carbon structure can also be impregnated with catalysts by incipient wetness, or physical or chemical adsorption.

The rigid, high porosity structures can be formed from regular nanotubes or nanotube aggregates, either with or without surface nanofibers (i.e., surface oxidized nanotubes). Surface oxidized nanotubes can be cross-linked according to methods described in U.S. Pat. No. 6,031,711 and U.S. Pat. No. 6,099,965, and then carbonized to from a rigid porous carbon structure having a uniform pore structure, substantially free of micropores.

Nanorods

The term nanorods refers to rod-like structures having a substantially solid core, a surface and a diameter greater than 1 nanometer but less than 100 nm. The structure has an aspect ratio between 5 and 500 and a length between 2 nm and 50 µm and preferably between 100 nm and 20 µm. The disclosed nanorods are substantially solid. They are not hollow with one open end, hollow with two open ends or hollow with two sealed ends.

Carbide Nanorods

Carbide-containing nanorods can be prepared by using carbon nanotubes as a source of carbon. For example, in WO/00/19121 incorporated herein by reference, carbide nanorods were prepared. Q-containing gas was reacted with carbon nanotubes to form, in situ, solid Q-containing carbide nanorods at temperatures substantially less than 1700° C. and preferably in the range of about 1000° C. to about 1400° C., and more preferably at approximately 1200° C. The Q-containing gases were volatile compounds capable of forming carbides.

This conversion is called pseudotopotactic because even though the dimensions and crystalline orientations of the starting material and product differ, the cylindrical geometry of the starting nanotube is retained in the final nanorod and the nanorods remain separate and predominately unfused to each other. The diameters of the resulting nanorods were about double that of the starting carbon nanotubes (1 nm-100 nm).

Carbide nanorods have also been prepared by reacting carbon nanotubes with volatile metal or non-metal oxide species at temperatures between 500° C. and 2500° C. wherein the carbon nanotube is believed to act as a template, spatially confining the reaction to the nanotube in accordance with methods described in PCT/US 96/09675 by C. M. Lieber. See also U.S. patent application Ser. No. 09/615,350 and Ser. No. 09/481,184 filed Jul. 12, 2000 and Jan. 12, 2000 respectively. Carbide nanorods formed by methods wherein the carbon nanotube serves as a template are also useful in the present invention.

Because of the ease with which they can penetrate fibril aggregates and rigid porous structures, volatile Q compounds are usually preferred. Volatile Q precursors are compounds having a vapor pressure of at least twenty torr at reaction temperature. Reaction with the volatile Q compound may or may not take place through a non-volatile intermediate.

Other methods of preparing carbide nanorods include reductive carburization in which the carbon nanotubes are reacted with Q-containing volatile metal oxides followed by passing a flow of gaseous $CH_4/H_2$ mixture at temperatures between 250° C. and 700° C. In addition to Q-containing metal oxides, volatile Q-containing compounds useful in preparation of Q-containing carbide nanorods include carbonyls and chlorides such as, for example, $Mo(CO)_6$, Mo(V) chloride or W(VI)O chloride.

In a preferred method of making useful carbide nanorods for the present invention, vapors of a volatile Q-containing compound are passed over a bed of extrudates of carbon nanotubes in a quartz tube at temperatures from about 700° C. to about 1000° C. By controlling the concentration of the Q-containing compound, the crystallization of the carbides is limited to the space of the nanotubes.

In all the methods of providing carbide-containing nanorods discussed above, the extent of conversion of the carbon in carbon nanotubes to carbide nanorods can be controlled by adjusting the concentration of the Q-containing compound, the temperature at which the reaction occurs and the duration of the exposure of carbon nanotubes to the volatile Q-containing compound. The extent of conversion of the carbon from the carbon nanotubes is between 0.5% and 100%, and preferably around 95%. The resulting carbide nanorods have an excellent purity level in the carbide content, vastly increased surface area and improved mechanical strength. The surface area of the carbide nanorods is from 1 to 400 and preferably 10 to 300 $m^2/gm$.

Applications for compositions based on carbide nanorods include catalysts and catalyst supports. For example, compositions including carbide nanorods based on molybdenum carbide, tungsten carbide, vanadium carbide, tantalum carbide and niobium carbide are useful as catalysts in fluid phase reactions.

Similarly, silicon carbide and aluminum carbide-containing nanorods are especially useful as catalyst supports for conventional catalysts such as platinum and palladium, as well as for other Q-containing carbides such as molybdenum carbide, tungsten carbide, vanadium carbide and the like.

Oxycarbide Nanorods

Oxycarbide-containing nanorods can be prepared from carbide nanorods. The carbide nanorods are subjected to oxidative treatments known in the art. For example, oxidative treatments are disclosed in U.S. Pat. No. 5,576,466; M. Ledoux, et al. European Pat. Appln. No. 0396 475 A1, 1989; C. Pham-Huu, et al., Ind. Eng. Chem. Res. 34, 1107-1113, 1995; E. Iglesia, et al., *Journal of Catalysis*, 131, 523-544, 1991. The foregoing oxidative treatments are applicable to the formation of oxycarbide nanorods as well as to the formation of nanotubes and/or nanorods comprising an oxycarbide portion wherein the conversion of the carbide source is incomplete.

Oxycarbide compounds present in an oxycarbide nanorod, and also present when the conversion of the carbide source is incomplete, include oxycarbides having a total amount of oxygen sufficient to provide at least 25% of at least 1 monolayer of absorbed oxygen as determined by temperature programmed desorption (TPD) based on the carbide content of the carbide source. For example, by subjecting carbide nanorods to a current of oxidizing gas at temperatures of between 30° C. to 500° C. oxycarbide nanorods are produced. Useful oxidizing gases include but are not limited to air, oxygen, carbon dioxide, nitrous oxide, water vapor and mixtures thereof. These gases may be pure or diluted with nitrogen and/or argon.

Compositions comprising oxycarbide nanorods are useful as catalysts in many fluid phase petrochemical and refining processes including hydrogenation, protonation, oxidation, hydrodesulfurisation, hydrodenitrogenation, hydrodemetallisation, hydrodeoxygenation, hydrodearomatization, dehydrogenation, hydrogenolysis, isomerization, alkylation, dealkylation and transalkylation.

Supported Carbides and Oxycarbides

According to another embodiment of the present invention, by adjusting the process parameters, for example, the temperature, the concentration of, and the length of exposure to the Q-containing volatile compound, it is possible to limit the rate of conversion of the carbon in the carbon nanotube. Thus, it is possible to provide carbon nanotubes having a carbide portion where the location of the carbide portion can be engineered as desired. For example, the carbide portion of the carbon nanotube can be located entirely on the surface of the carbon nanotube such that only parts of the surface comprise nanocarbide compounds. It is possible to have the entire surface of the carbon nanotube coated with carbides while the core of the carbon nanotube remains substantially carbon. Moreover, it is possible to control the surface coverage of carbon nanotubes with carbide compounds at from 1% to 99% of the entire surface area. An embodiment wherein the carbon nanotube comprises carbide covering less than 50% of the surface of the carbon nanotube is preferred. Of course, at low percentages large areas of the carbon nanotube surface remain uncovered. Nevertheless, as long as the carbide portion of the carbon nanotube is retained at the surface, the morphology of the carbon nanotube remains substantially the same. Similarly, through careful control of the process parameters, it is possible to turn the carbide portion of the nanotube into a carbide nanorod thereby obtaining a nanotube-nanorod hybrid structure. The carbide portion can be located anywhere on the carbon nanotube. Partial conversion of carbon to carbide compounds preferably varies from about 20% to about 85% by weight. When the content of carbide compounds in the carbon nanotube exceeds 85% by weight, the carbon nanotubes have been substantially converted to carbide nanorods. Once in possession of the teachings herein, one of ordinary skill in the art can determine as a routine matter and without the need for undue experimentation how to control the rate of conversion of carbon nanotubes to carbide nanorods in order to convert the carbon in the carbon nanotubes incompletely.

The embodiment of the invention where the carbon nanotubes contain a carbide portion also encompasses providing the carbide portion of the carbon nanotube in any manner now known or later developed. For example, in another method of providing carbide compounds on carbon nanotubes or aggregates thereof, the Q-containing metal or metal compound, preferably molybdenum, tungsten, or vanadium is placed on the carbon nanotubes or aggregates directly and then pyrolyzed, leaving behind carbon nanotubes coated with carbide compounds.

In yet another method of providing carbide compounds on carbon nanotubes, solutions of Q-containing salts, such as, for example, salts of molybdenum, tungsten, or vanadium are dispersed over the carbon nanotubes or aggregates thereof and then pyrolyzed, again forming carbide compounds primarily on the surface of the carbon nanotubes.

An embodiment wherein the core of the carbon nanotube remains carbon and the location of the metallic carbides is limited is quite desirable as a catalytic system. The core of the carbon nanotube acts as a catalyst support or carrier for the metallic carbide catalyst.

In yet another embodiment of the invention, it is possible to transform the core of the carbon nanotubes into one metal carbide preferably silicon carbide or aluminum carbide at temperatures between 1100° C. and 1400° C. Thereafter, by bringing the silicon carbide nanorod in contact with the volatile compound of another metal, for example, MoO, a mixed carbide nanorod is provided which has a silicon carbide (preferably β SiC), core and another Q-based carbide portion. When MoO is used for example, the SiC nanorod can have a MoC portion that could be an outer layer or a MoC-based nanorod. Thus, the resulting nanorod is a mixed carbide-based nanorod wherein part of the nanorod is SiC-based and another portion is MoC-based. There is likewise an advantageous presence of molybdenum silicide. The mixed carbide nanotube or nanorods as discussed above are particularly suitable as catalyst carriers or directly as catalysts in high temperature chemical reactions, particularly in the petrochemical field.

In yet another embodiment of the improvement discussed above, it is possible to subject the nanotube having a carbide portion to oxidative treatments such that the carbide portion of the nanotube further comprises an oxycarbide portion. The oxycarbide portion comprises oxycarbide compounds located any place on, in and within the carbon nanotube or carbide nanorod.

The oxycarbide compounds can be placed on the nanotube in any way now known or later developed. Similarly, the nanotube having a carbide portion can be exposed to air or subjected to carburization or any other means of converting the carbide portion of the nanotube partially or completely into an oxycarbide nanorod portion. Thus, it is possible to provide a carbon nanotube which is partly still a carbon nanotube, partly a carbide nanorod and partly an oxycarbide nanorod. This may be referred to as a carbon-carbide-oxycarbide nanotube-nanorod hybrid.

Carbide and Oxycarbide Rigid Porous Structures

The invention also relates to rigid porous structures made from carbide nanorods, oxycarbide nanorods, and supported carbide and oxycarbide carbon nanotubes and methods for producing the same. The resulting structures may be used in catalysis, chromatography, filtration systems, electrodes, batteries and the like.

The rigid porous structures according to the invention have high accessible surface area. That is, the structures have a high surface area which is substantially free of micropores. The invention relates to increasing the mechanical integrity and/or rigidity of porous structures comprising intertwined carbon nanotubes and/or carbide and/or oxycarbide nanorods. The structures made according to the invention have higher crush strengths than the conventional carbon nanotube or nanorod structures. The present invention provides a method of improving the rigidity of the carbon structures by causing the nanotubes and/or nanorods to form bonds or become glued with other nanotubes and/or nanorods at the nanotube and/or nanorod intersections. The bonding can be induced by chemical modification of the surface of the nanotubes to promote bonding, by adding "gluing" agents and/or by pyrolyzing the nanotubes to cause fusion or bonding at the interconnect points.

The nanotubes or nanorods can be in the form of discrete nanotubes and/or nanorods or aggregate particles of nanotubes and nanorods. The former results in a structure having fairly uniform properties. The latter results in a structure having two-tiered architecture comprising an overall macrostructure comprising aggregate particles of nanotubes and/or nanorods bonded together and a microstructure of intertwined nanotubes and/or nanorods within the individual aggregate particles.

According to one embodiment, individual discrete nanotubes and/or nanorods form the structure. In these cases, the distribution of individual nanotube and/or nanorod strands in the particles are substantially uniform with substantially regular spacing between strands. These spacings (analogous to pores in conventional supports) vary according to the densities of the structures and range roughly from 15 nm in the densest to an average 50 to 60 nm in the lightest particles (e.g., solid mass formed from open net aggregates). Absent are cavities or spaces that would correspond to micropores in conventional carbon supports.

According to another embodiment, the distribution of individual nanotubes and/or nanorods is substantially nonuniform with a substantially nonuniform pore structure. Nevertheless, there are no cavities or spaces corresponding to micropores which are frequently present in other catalysts and catalyst supports.

These rigid porous materials are superior to currently available high surface area materials for use in fixed-bed reactors, for example. The ruggedness of the structures, the porosity (both pore volume and pore structure), and the purity of the carbide nanorods and/or oxycarbide nanorods are significantly improved. Combining these properties with relatively high surface areas provides a unique material with useful characteristics.

One embodiment of the invention relates to a rigid porous structure comprising carbide nanorods having an accessible surface area greater than about 10 $m^2/gm$ and preferably greater than 50 $m^2/gm$, being substantially free of micropores and having a crush strength greater than about 1 lb. The structure preferably has a density greater than 0.5 $gm/cm^3$ and a porosity greater than 0.8 $cm^3/gm$. Preferably, the structure comprises intertwined, interconnected carbide nanorods and is substantially free of micropores.

According to one embodiment, the rigid porous structure includes carbide nanorods comprising oxycarbide compounds, has an accessible surface area greater than about 10 $m^2/gm$, and preferably greater than 50 $m^2/gm$, is substantially free of micropores, has a crush strength greater than about 1 lb and a density greater than 0.5 $gm/cm^3$ and a porosity greater than 0.8 $cm^3/gm$.

According to another embodiment the rigid porous structure includes oxycarbide nanorods having an accessible surface area greater than about 10 $m^2/gm$, and preferably greater than 50 $m^2/gm$, being substantially free of micropores, having a crush strength greater than about 1 lb, a density greater than 0.5 $gm/cm^3$ and a porosity greater than 0.8 $cm^3/gm$.

According to yet another embodiment, the rigid porous structure includes carbon nanotubes comprising a carbide portion. The location of the carbide portion can be on the surface of the carbon nanotube or any place on, in or within the carbon nanotube or the carbide portion can be converted into a carbide nanorod forming a carbon nanotube-carbide nanorod hybrid. Nevertheless, the catalytic effectiveness of these rigid porous structures is not affected by the carbide portion on the resulting composites. This rigid porous structures has an accessible surface area greater than about 10 $m^2/gm$ and preferably than 50 $m^2/gm$, is substantially free of micropores, has a crush strength greater than about 1 lb, a density greater than 0.5 $gm/cm^3$ and a porosity greater than 0.8 $cm^3/gm$.

In another related embodiment the rigid porous structure includes carbon nanotubes having a carbide portion and also an oxycarbide portion. The location of the oxycarbide portion can be on the surface of the carbide portion or any place on, in or within the carbide portion.

Under certain conditions of oxidative treatment it is possible to convert a portion of the carbide nanorod part of the carbon-carbide nanotube-nanorod hybrid into an oxycarbide. The rigid porous structure incorporating carbon-carbide-oxycarbide nanotube-nanorod hybrids has an accessible surface area greater than about 10 m²/gm, is substantially free of micropores, has a crush strength greater than about 1 lb, a density greater than 0.5 gm/cm³ and a porosity greater than 0.8 cm³/gm.

According to one embodiment, the rigid porous structures described above comprise nanotubes and/or nanorods which are uniformly and evenly distributed throughout the rigid structures. That is, each structure is a rigid and uniform assemblage of nanotubes and/or nanorods. The structures comprise substantially uniform pathways and spacings between the nanotubes and/or nanorods. The pathways or spacings are uniform in that each has substantially the same cross-section and are substantially evenly spaced. Preferably, the average distance between nanotubes and/or nanorods is less than about 0.03 μm and greater than about 0.005 μm. The average distance may vary depending on the density of the structure.

According to another embodiment, the rigid porous structures described above comprise nanotubes and/or nanorods which are nonuniformly and unevenly distributed throughout the rigid structures. The rigid structures comprise substantially nonuniform pathways and spacings between the nanorods. The pathways and spacings have nonuniform cross-section and are substantially unevenly spaced. The average distance between nanotubes and/or nanorods varies between 0.0005 μm to 0.03 μm. The average distances between nanotubes and/or nanorods may vary depending on the density of the structure.

According to another embodiment, the rigid porous structure comprises nanotubes and/or nanorods in the form of nanotube and/or nanorod aggregate particles interconnected to form the rigid structures. These rigid structures comprise larger aggregate spacings between the interconnected aggregate particles and smaller nanotube and/or nanorod spacings between the individual nanotubes and/or nanorods within the aggregate particles. Preferably, the average largest distance between the individual aggregates is less than about 0.1 μm and greater than about 0.001 μm. The aggregate particles may include, for example, particles of randomly entangled balls of nanotubes and/or nanorods resembling bird nests and/or bundles of nanotubes and/or nanorods whose central axes are generally aligned parallel to each other.

Another aspect of the invention relates to the ability to provide rigid porous particulates or pellets of a specified size dimension. For example, porous particulates or pellets of a size suitable for use in a fluidized packed bed. The method involves preparing a plurality of nanotubes and/or nanorods aggregates, fusing or gluing the aggregates or nanotubes and/or nanorods at their intersections to form a large rigid bulk solid mass and sizing the solid mass down into pieces of rigid porous high surface area particulates having a size suitable for the desired use, for example, to a particle size suitable for forming a packed bed.

General Methods of Making Rigid Porous Structures

The above-described rigid porous structures are formed by causing the nanotubes and/or nanorods to form bonds or become glued with other nanofibers at the fiber intersections. The bonding can be induced by chemical modification of the surface of the nanofibers to promote bonding, by adding "gluing" agents and/or by pyrolyzing the nanofibers to cause fusion or bonding at the interconnect points. U.S. Pat. No. 6,099,965 to Tennent describes processes for forming rigid porous structures from carbon nanotubes. These processes are equally applicable to forming rigid porous structures including discrete unstructured nanotubes or nanotube aggregates comprising carbides and in another embodiment also oxycarbides, wherein the carbon nanotube morphology has been substantially preserved. These methods are also applicable to forming rigid porous structures comprising carbide or oxycarbide nanorods, unstructured or as aggregates. Additionally, these methods are also applicable to forming rigid porous structures comprising hybrids of carbon-carbide nanotube-nanorods and/or carbon-carbide-oxycarbide nanotube-nanorods.

In several other embodiments rigid porous structures comprising carbide nanorods are prepared by contacting a rigid porous carbon structure made of carbon nanotubes with volatile Q-containing compounds under conditions sufficient to convert all of the carbon or only part of the carbon of the carbon nanotubes to carbide-containing compounds.

Methods of Making Carbide Containing Rigid Porous Structures

There are many methods of preparing rigid porous structures comprising carbide nanorods. In one embodiment the rigid porous carbon structures prepared as described above are contacted with Q-containing compounds under conditions of temperature and pressure sufficient to convert the carbon nanotubes of the rigid porous carbon structure to carbide nanorods. The carbide portion of the carbon nanotubes of the rigid porous structure can be on the surface of the carbon nanotube or at any place on, in or within the carbon nanotube. When the conversion is complete, the entire carbon nanotube is transformed into a substantially solid carbide nanorod. Once in the possession of the teachings herein, one of ordinary skill in the art can determine as a routine matter and without the need for undue experimentation how to control the rate of conversion of carbon nanotubes present in the rigid porous carbon structure to a rigid porous carbide-containing structure comprising carbon nanotubes having a carbide portion located at various places on the carbon nanotube present in an amount from about 20% to about 85%, preferably in excess of 85% by weight.

The carbide-containing rigid porous structures of the present invention have high accessible surface areas between 10 m²/gm and 100 m²/gm and are substantially free of micropores. These structures have increased mechanical integrity and resistance to attrition in comparison to individual carbide-containing nanorods. Carbide-containing rigid porous structures have a density greater than 0.5 gm/cm³ and a porosity greater than 0.8 cm³/gm. The structure has at least two dimensions of at least 10 μm and not greater than 2 cm. Depending on the pore structure of the starting rigid porous carbon structure, the structure of the carbide-containing rigid porous structure can be uniform, nonuniform or bimodal.

When the rigid porous structure is uniform the average distance between the carbide-containing nanorods is less than 0.03 μm and greater than 0.005 μm. In another embodiment the rigid porous structure comprises carbide-containing nanorods in the form of interconnected aggregate particles wherein the distance between individual aggregates ranges from point of contact to 1 μm. When the carbide-containing nanorod rigid porous structures are formed from rigid porous carbon structures comprising nanotube aggregates, the structure has aggregate spacings between interconnected aggregate particles and carbide nanorod spacings between nanorods within the aggregate particles. As a result the rigid porous structure has a bimodal pore distribution.

One embodiment of the invention relates to rigid porous structures comprising extrudates of aggregate particles of carbide nanorods, wherein the carbide nanorods are glued together with binding agents such as cellulose, carbohydrates, polyethylene, polystyrene, nylon, polyurethane, polyester, polyamides, poly(dimethylsiloxane) and phenolic resins. Without being bound by theory, it is believed that the conversion of a rigid porous carbon structure to a carbide-containing rigid porous structure, whether completely or partially, is accomplished in pseudotopotactic manner as previously discussed.

Methods of Making Oxycarbide Containing Rigid Porous Structures

There are many methods of preparing rigid porous structures comprising oxycarbide nanorods and/or nanotubes comprising a carbide portion and an oxycarbide portion. In one embodiment the carbide containing rigid porous structures are subjected to oxidative treatments as disclosed in the art and in U.S. Pat. No. 5,576,466.

In another embodiment rigid porous structures comprising carbon nanotubes having an oxycarbide portion and/or a carbide portion are prepared by subjecting rigid porous carbon structures which have been partially converted to carbide nanorods to oxidative treatments disclosed in the art.

In another embodiment discrete carbide nanorods are subjected to oxidative treatments and then assembled into rigid porous structures according to methods similar to those disclosed in U.S. Pat. No. 6,099,965.

In yet another embodiment discrete carbon nanotubes or aggregate of carbon nanotubes which have been partially converted to carbide nanorods are further subjected to oxidative treatments and then assembled into rigid porous structures according to methods disclosed in U.S. Pat. No. 6,099,965.

Catalytic Compositions

The carbide and/or oxycarbide nanorods and nanotubes having carbide and/or oxycarbide portions of the invention, have superior specific surface areas as compared to carbide and oxycarbide catalysts previously taught in the art. As a result, they are especially useful in the preparation of catalysts and as catalyst supports in the preparation of supported catalysts. The catalysts of the invention include catalytic compositions comprising nanotubes and/or nanorods and rigid porous structures comprising the same. These "self-supported" catalysts of the invention constitute the active catalyst compound and can be used with or without any additional physical support to catalyze numerous heterogeneous, fluid phase reactions as more specifically described herein. The supported catalysts of the invention comprise a support including a nanofiber and/or nanorod rigid porous structure and a catalytically effective amount of a catalyst supported thereon. The catalytic compositions can contain from about 10% to 95% carbides by weight of the composition. The catalyst compositions can further include from about 0.5% to 25% oxycarbides by weight of the carbides of the composition.

The uniquely high macroporosity of carbon nanotube or carbide nanorod structures, the result of their macroscopic morphology, greatly facilitates the diffusion of reactants and products and the flow of heat into and out of the self-supported catalysts. This unique porosity results from a random entanglement or intertwining of nanotubes and/or nanorods that generates an unusually high internal void volume comprising mainly macropores in a dynamic, rather than static state. Ease of separation of these catalysts from the fluid phase and lower losses of these catalyst as fines also improves process performance and economics. Other advantages of the nanotube and/or nanorod structures as self-supported catalysts include high purity, improved catalyst loading capacity and chemical resistance to acids and bases. As self-supported catalysts, carbon nanotube and/or nanorod aggregates have superior chemical and physical properties in respect of their porosity, surface area, separability and purity.

Self-supported catalysts made of nanotubes and/or nanorods have a high internal void volume that ameliorates the plugging problem encountered in various processes. Moreover, the preponderance of large pores obviates the problems often encountered in diffusion or mass transfer limited reactions. The high porosities ensure significantly increased catalyst life.

One embodiment of the invention relates to a self-supported catalyst which is a catalytic composition comprising carbide-containing nanorods having a diameter between at least 1 nm and less than 100 nm, and preferably between 3.5 nm and twenty nm. The carbide-containing nanorods have been prepared from carbon nanotubes which have been substantially converted to carbide nanorods. In the catalytic compositions of this embodiment the carbide nanorods retain substantially the structure of the original carbon nanotubes. Thus, the carbide nanotubes can have uniform, nonuniform or bimodal porous structures. These catalytic compositions can be used as catalysts to catalyze reactions such as hydrogenation, protonation, oxidation, hydrodesulfurisation, hydrodenitrogenation, hydrodemetallisation, hydrodeoxygenation, hydrodearomatization, dehydrogenation, hydrogenolysis, isomerization, alkylation, dealkylation and transalkylation.

Catalytic Compositions Supported on Aggregates of Carbide and Oxycarbide Nanorods Depending upon the application, the rigid porous structures of the invention can be used as both self-supported catalysts and as catalyst supports. As is true of catalysts comprising regular nanotubes and/or nanorods, catalysts and catalyst supports comprising the rigid porous structures of the invention have unique properties. They are relatively free of micropores. They are also pure and resistant to attrition, compression and shear. Consequently, they can be easily separated from a fluid phase reaction medium and after a long service life. The rigid porous structures of the invention can be used as catalysts and catalyst supports in a variety of fixed bed catalytic reactions.

Rigid structures formed from nanorod aggregates, preferably silicon carbide and aluminum carbide-containing nanorods, are particularly preferred structures for use as catalyst supports.

The combination of properties offered by nanorod structures is unique. Known catalyst supports do not have such high porosity, high accessible surface area and attrition resistance. This combination of properties is advantageous in any catalyst system amenable to the use of a carbide catalyst support. The multiple nanorods that make up a nanorod structure provide a large number of junction points at which catalyst particles can bond to the structures. This provides a catalyst support that tenaciously holds the supported catalyst. Further, nanorod structures permit high catalyst loadings per unit weight of nanorod. Catalyst loadings are generally greater than 0.01 weight percent and preferably greater than 0.1, but generally less than 5% weight containing on the total weight of the supported catalyst. Typically catalyst loadings greater than 5% by weight are not useful, but such catalyst loadings are easily within the contemplation of the invention, as are loadings in excess of 50 weight percent containing of the total weight of the supported catalyst.

Desirable hydrogenation catalysts which can be supported on the nanorod and/or nanotube structures of the invention are the platinum group of metals (ruthenium, osmium, rhodium, iridium, palladium and platinum or a mixture thereof), preferably palladium and platinum or a mixture thereof. Group VII metals including particularly iron, nickel and cobalt are also attractive hydrogenation catalysts.

Oxidation (including partial oxidation) catalysts may also be supported on the nanotube and/or nanorod structures. Desirable metallic oxidation catalysts include, not only members of the platinum group enumerated above, but also, silver and the group VIII metals. Oxidation catalysts also include metal salts known to the art including salts of vanadium, tellurium, manganese, chromium, copper, molybdenum and mixtures thereof as more specifically described in *Heterogeneous Catalytic Reactions Involving Molecular Oxygen*, by Golodets, G. I. & Ross, J. R. H, *Studies in Surface Science*, 15, Elsevier Press, NYC 1983.

Active catalysts include other carbide compounds such as carbides of titanium, tantalum, hafnium, niobium, zirconium, molybdenum, vanadium and tungsten. These carbides are particularly useful for hydrogenation, protonation, oxidation, hydrodesulfurisation, hydrodenitrogenation, hydrodemetallisation, hydrodeoxygenation, hydrodearomatization, dehydrogenation, hydrogenolysis, isomerization, alkylation, dealkylation and transalkylation.

Because of their high purity, carbide nanorod aggregates exhibit high resistance to attack by acids and bases. This characteristic is advantageous since one path to regenerating catalysts is regeneration with an acid or a base. Regeneration processes can be used which employ strong acids or strong bases. This chemical resistance also allows the carbide supports of the invention to be used in very corrosive environments.

Preparation of Supported Catalysts

Supported catalysts are made by depositing a catalytically effective amount of catalyst on the rigid nanorod and/or nanotube structure. The term "on the nanotube and/or nanorod structure" embraces, without limitation, on, in and within the structure and on the nanotubes and/or nanorods thereof. These terms may be used interchangeably. The catalyst can be incorporated onto the nanotube and/or nanorod or aggregates before the rigid structure is formed, while the rigid structure is forming (i.e., it can be added to the dispersing medium) or after the rigid structure is formed.

Methods of depositing the catalyst on the support include adsorption, incipient wetness, impregnation and precipitation. Supported catalysts may be prepared by either incorporating the catalyst onto the aggregate support or by forming it in situ and the catalyst may be either active before it is deposited in the aggregate or it may be activated in situ.

Catalysts such as a coordination complexes of catalytic transition metals, e.g., palladium, rhodium or platinum, and a ligand, such as a phosphine, can be adsorbed on a support by slurrying nanorods in a solution of the catalyst or catalyst precursor for an appropriate time to achieve the desired loading.

These and other methods may be used in forming the catalyst supports. A more detailed description of suitable methods for making catalyst supports using nanotube structures is set forth in U.S. Pat. No. 6,099,965.

Catalytic Compositions and Their Uses

The above described catalytic compositions are suited for use in fluid phase reactions such as hydrogenation, protonation, oxidation, hydrodesulfurisation, hydrodenitrogenation, hydrodemetallisation, hydrodeoxygenation, hydrodearomatization, dehydrogenation, hydrogenolysis, isomerization, alkylation, dealkylation, and transalkylation.

Another embodiment of the invention relates to a catalyst comprising a composition including a multiplicity of Q-based nanorods, wherein Q is selected from the group consisting of B, Si, Al, Ti, Ta, Nb, Zr, Hf, Mo, V and W. The resulting carbide nanorods can be distributed nonuniformly, uniformly or can be in the form of interconnected aggregate particles.

In a related embodiment, the catalyst comprises a rigid porous structure based on the Q-based nanorods described above which have been formed into extrudates and connected by gluing agents or in any other manner sufficient to form the rigid porous structure. Each catalytic composition discussed immediately above can be used as catalysts in a fluid phase reaction selected from the group consisting of hydrogenation, protonation, oxidation, hydrodesulfurisation, hydrodenitrogenation, hydrodemetallisation, hydrodeoxygenation, hydrodearomatization, dehydrogenation, hydrogenolysis, isomerization, alkylation, dealkylation and transalkylation.

Another embodiment relates to a catalyst comprising a composition including a multiplicity of carbide-based nanorods which further comprise oxycarbide compounds any place on, in or within the nanorod, preferably on the surface.

In a related embodiment the catalyst comprises a rigid porous structure including the carbide-based nanorods comprising oxycarbides which have been formed into extrudates connected into the rigid porous structure by gluing agents or in any other manner sufficient to form the rigid porous structure. Each catalytic compositions discussed immediately above can be used as a catalyst in a fluid phase reaction selected from the group consisting of hydrogenation, protonation, oxidation, hydrodesulfurisation, hydrodenitrogenation, hydrodemetallisation, hydrodeoxygenation, hydrodearomatization, dehydrogenation, hydrogenolysis, isomerization, alkylation, dealkylation and transalkylation.

Another embodiment relates to a catalyst comprising a composition including a multiplicity of carbon nanotubes having substantially uniform diameters. In this embodiment the carbon nanotubes comprise carbide compounds anywhere on, in or within the nanotubes, but preferably on the surface of the nanotubes. In yet another related embodiment the carbon nanotubes additionally comprise oxycarbide compounds on, in or within the nanotubes, but preferably on the surface as more specifically described in section "Supported Carbides and Oxycarbides" of the of the specification. In these embodiments the nanotube morphology is substantially retained.

In a related embodiment the catalyst comprises a rigid porous structure including carbon nanotubes comprising carbide compounds and, in another embodiment, also oxycarbide compounds as described above. Each rigid porous structure is useful as a catalyst in a fluid phase reaction to catalyze a reaction selected from the group consisting of hydrogenation, protonation, oxidation, hydrodesulfurisation, hydrodenitrogenation, hydrodemetallisation, hydrodeoxygenation, hydrodearomatization, dehydrogenation, hydrogenolysis, isomerization, alkylation, dealkylation and transalkylation.

In another embodiment the catalytic composition includes a multiplicity of carbon nanotubes having a carbide portion which has been converted to a carbide nanorod forming a nanotube-nanorod hybrid structure. In another related embodiment, the catalytic composition includes a multiplicity of carbon nanotubes having a carbide nanorod portion and in addition also an oxycarbide portion which has been converted to an oxycarbide nanorod. In yet other related embodiments the foregoing carbon nanotubes can be included in rigid porous structures, wherein the carbon nanotubes are formed into extrudates and/or are otherwise connected to form rigid porous structures. The catalytic compositions are useful as catalysts in a fluid phase reaction.

Fluid Phase Reactions Using Catalysts Containing Carbide or Oxycarbides

Carbide and/or oxycarbide catalysts can be used to catalyze fluid phase reactions such as hydrogenation, protonation, oxidation, hydrodesulfurisation, hydrodenitrogenation, hydrodemetallisation, hydrodeoxygenation, hydrodearomatization, dehydrogenation, hydrogenolysis, isomerization, alkylation, dealkylation and transalkylation.

For example for isomerization reactions, such as the isomerization of alkanes, any straight-chain, branched or cyclic alkane can be employed as a feed hydrocarbon in the isomerization process. Examples of alkanes which can be isomerized include, but are not limited to, n-butane, n-pentane, n-hexane, 2-methylpentane, 3-methylpentane, n-heptane, 2-methylhexane, 3-methylhexane, octanes, nonanes, decanes and combinations thereof. Alkenes, or olefins, can also be isomerized using the catalysts.

Any suitable isomerization conditions can be employed in the process of the invention. A feed hydrocarbon and a carrier gas such as hydrogen are premixed to create an isomerization feed stream which is then charged to an isomerization zone, i.e., a vapor phase reactor vessel. The feed stream contacts a catalytic composition of the invention that has been placed within the reactor vessel.

The effluent from the reactor vessel is subjected to suitable separation techniques as known in the art, to separate the desired isomer product from reactants and by-products. For example, in the isomerization of normal butane to isobutane, the following process can be used. A vapor phase reactor is constructed by assembling a thermowell through an end of a vertical quartz tube. A vertical quartz tube with a 12 mm outer diameter is fitted with a 6 mm quartz thermowell. At the tip of the thermowell, is a porous plug of quartz wool. This porous plug is used to support the catalyst and/or the catalyst support containing the catalyst. The entire tube is then placed in a tube furnace, for example a ½-inch tube furnace, in a vertical orientation. The top of the tube is fitted with inlet lines for the feed stream of reactant gases. At the bottom of the tube is an exit line connected to a pressure gauge, e.g., a gauge measuring pressure between 0 and 15 psi. Mass flow controllers are placed in the gas inlet lines to control the flow of reactant gases into the reactor. Suitable mass flow controllers include those manufactured by Allborg Instruments and Controls of Orangeburg, N.Y.

Ground catalyst or supported catalyst is placed onto the quartz wool plug. The catalytic composition is then treated with hydrogen and argon gas. Thereafter, the catalytic composition can be treated with oxygen and argon gas to make oxycarbide compositions.

Mixtures of the gas to be isomerized, e.g., n-butane, and hydrogen in molar ratios of about 1:16 to 1:4 of n-butane:$H_2$ are introduced into the vapor phase reactor at WHSVs of 1-10 $h^{-1}$. Temperatures and pressures for the reaction can range from 100° C. to about 400° C., and 1 to about 10 psi, respectively.

Product gases are fed through a gas sampling valve. Gas chromatography ("GC") can be used to analyze the composition of the product gas and determine the conversion and selectivity of the reaction. For example, a Varian gas chromatograph equipped with a GS-Q capillary column can be used to measure $C_1$-$C_5$ alkanes and olefins. The capillary columns can be obtained from Alltech Associates of Deerfield, Ill.

Hydrogenation reactions can also be catalyzed by the catalysts of the present invention. The catalysts can be used in any hydrogenation reactions that traditionally use noble metals such as platinum or rhenium; the carbide and/or oxycarbide catalysts replace the noble metal catalyst. Hydrocarbons that can hydrogenated include, but are not limited to, hydrocarbons with unsaturated carbon-carbon double or triple bonds, as well as unsaturated alcohols, aldehydes, ketones, esters, and any other hydrocarbon that has unsaturated double and/or triple bonds. The reaction conditions for the hydrogenation reaction vary with the type of hydrocarbon being hydrogenated. One of ordinary skill in the art would be aware of the proper reaction conditions.

Hydrodesulfurisation reactions can also be catalyzed by the carbide and/or oxycarbide catalysts. Sulfur containing compounds that can undergo hydrodesulfurisation include but are not limited to thiophene, dibenzylthiophene and dimethyl dibenzyl thiophene. For example, reaction conditions can include temperatures ranging from 250 to 400° C. and pressures ranging from 1 to 10 MPa.

EXAMPLES

The examples are illustrative and not to be considered restrictive of the scope of the invention. Numerous changes and modification can be made with respect to the invention. The materials used in the examples herein are readily commercially available.

In all of the experiments which follow, aggregates of carbon nanotubes as manufactured by Hyperion Catalysis International of Cambridge, Mass. were used. The aggregates of carbon nanotubes were of the cotton candy ("CC") morphology also known as combed yarn ("CY") as described in the section entitled "Nanotube Aggregates and Assemblages".

Example 1

Preparation of Molybdenum Carbide Precursors by Impregnation of Carbon Nanotube Aggregates with Molybdenum Acetyl Acetonate Five gms of powder samples of CC aggregates having porosity of 6.5 cc/gm were impregnated by the incipient wetness method with 35 cc of an ethanol solution containing the correct amount of $MoO_2(C_5H_7O_2)_2$ or (molybdenum acetyl acetonate, referred to as Moacac) necessary for the desired C:Mo atom ratio loading. The resulting mixture was dried at 110° C. at full vacuum for 18 hours during which the Mo precursor decomposed to a mixture of molybdenum suboxides, generally designated as $MoO_{3-x}$, wherein x is 0 or 1. The sample was set aside for conversion to carbide catalysts by careful calcination under an inert atmosphere as described in Examples 5, 6 or 7 below.

Example 2

Preparation of Molybdenum Carbide Precursors by Impregnation of Carbon Nanotube Aggregates with Ammonium Molybdate A similar procedure as used in Example 1 above was followed, except that the impregnating solutions were aqueous solutions containing the correct amount of ammonium heptamolybdate tetrahydrate $((NH_4)_6Mo_7O_{24}.4H_2O$, referred to as ammonium molybdate) necessary for the desired C:Mo atom ratio loading. The resulting mixtures were dried at 225° C. in full vacuum for 18 hours during which the heptamolybdate compound was decomposed to $MoO_3$. The sample was set aside for conversion to carbide catalysts by careful calcination under an inert atmosphere as more particularly described in Examples 5, 6 and 7 herein.

Example 3

Preparation of Molybdenum Carbide Extrudate Precursors by Impregnation with Molybdenum Acetyl Acetonate or Ammonium Molybdate CC or CY type aggregates were oxidized with nitric acid as described in U.S. Pat. No. 6,203,814 to Fischer to form oxidized CC aggregates having an acid titer of about 0.6 meq/gm.

Five gms of the oxidized CC type aggregates of carbon nanotubes were well-mixed with either an ethanol solution of Moacac or an aqueous solution of ammonium heptamolybdate tetrahydrate, each solution containing the correct amount of Mo compound necessary for the desired C:Mo loading. The mixing was accomplished by kneading in a Braybender kneader until the paste had a homogeneous consistency. The excess solvent was removed from the kneaded sample by evaporation until a solids content of from about 8 to about 10% by weight was obtained. The material was then extruded by using a pneumatic gun extruder. The extrudates were about ⅛" in diameter and several centimeters in length. The extrudates were then dried at 200° C. in air for 18 hours during which some shrinkage occurred. The dried extrudates were then broken into pieces of about ¹⁄₁₆" by ¼" which were set aside for conversion to carbide catalysts by careful calcination as described in Examples 5, 6 and 7 herein.

Example 4

Preparation of Molybdenum Carbide Precursor by Mixing Carbon Nanotube Aggregates With Ammonium Molybdate or Molybdenum Oxide As grown CC or CY aggregates were oxidized with nitric acid as described in Example 3 to form oxidized CC aggregates having an acid titer of about 0.6 meq/gm.

Five gms of oxidized CC type aggregates of carbon nanotubes were physically admixed with the correct amount of either ammonium heptamolybdate tetrahydrate or $MoO_3$ necessary for the desired C:Mo atom ratio by kneading the sample in a mortar and pestle. A small amount of wetting agent such as water or ethylene glycol, was added periodically to keep the oxidized carbon nanotube powder dusting under control and to facilitate the contact between the molybdenum precursor particles and the carbon nanotube aggregates. After the mix was kneaded to a homogeneous thick paste, the excess solvent was removed by gentle warming while continuing to knead the sample. The mixture was then dried at 200° C. for 14 hours in air and set aside for conversion to carbide by careful calcination as described in Examples 5, 6 and 7 herein.

Example 5

Calcination of Molybdenum Carbide Precursors at 600° C. or 625° C.

Weighed samples of molybdenum carbide precursors, as prepared in Examples 1-4 were loaded into porcelain boats which were then placed horizontally in a one-inch quartz tube. The tube and boat assembly were placed in a high temperature furnace equipped with a programmable temperature controller and a movable thermocouple. The thermocouple was located directly in contact with the end of the boat. The sample was heated under a slow flow, i.e., at several standard cc's/min of argon at a heating rate of 5° C./min to 200° C. and thereafter at 1° C./min to the final temperature of 600° C. or 625° C. The sample was held at this temperature for 18 hours. Since pure $Mo_2C$ reacts violently with atmospheric oxygen, after cooling in argon to ambient temperature, the samples were passivated by passing 3% $O_2$/Ar over them for 1 hour. XRD phase analysis indicated that the precursors have converted into $\beta$-$Mo_2C$ and/or $\gamma$-$Mo_2C$ with minor component of $MoO_2$.

Example 6

Calcination of Molybdenum Carbide Carbon Precursors at 800° C.

The same procedure as described in Example 5 above was followed up to 600° C. The samples were then held at 600° C. for 1 hour. Thereafter, heating was resumed at the same rate of 1° C./min to 800° C. and held at that temperature for another 3 hours. After cooling in argon, the samples were passivated using 3% $O_2$/Ar. XRD phase analysis indicated that the precursors have converted into $\beta$-$Mo_2C$.

Example 7

Calcination of Molybdenum Carbide Carbon Precursors at 1000° C.

The same procedure as described in Example 6 above was followed up to 800° C., at which temperature the samples were held for 1 hour. Thereafter, heating of the samples was resumed at the rate of 1° C./min to 1000° C., where the temperature was maintained for 0.5 hours. After cooling in argon, the samples were passivated using 3% $O_2$/Ar. XRD phase analysis indicated that the precursors have converted into $\beta$-$Mo_2C$.

Results of Examples 1-7

Carbide nanorods and carbide nanoparticles supported on carbon nanotubes were prepared according to Examples 1 to 7 above. Table 1 below summarizes the experimental conditions and XRD results for selected experiments.

TABLE 1

SUMMARY OF RESULTS FOR MOLYBDENUM CARBIDE PREPARATIONS

| SAMPLE | Mo Source | T °C. | C:Mo initial | Weight loss (theor.) | PHASES, XRD |
|---|---|---|---|---|---|
| 1 | Moacac (s)[b] | 600 | 4 (94)[e] | 27 (44) | C, $MoO_2$, $Mo_2C$ (hex) |
| 2 | $MoO_3$ (s)[a] | 800 | 35 (38)[e] | 23 (35) | C, $Mo_2C$ (cub) |
| 3 | $MoO_3$ (s)[a] | 800 | 40 (34)[e] | n/a | C, $Mo_2C$ (hex) |
| 4 | Moacac (s)[b] | 800 | 10 (85)[e] | 31 (32) | C, $Mo_2C$ (hex) |
| 5 | Moacac (s)[b] | 800 | 20 (57)[e] | 27 (22) | $Mo_2C$ (hex/cub), Mo |
| 6 | $MoO_3$ (s)[b] | 1000 | 10 (85)[e] | 41 (32) | $Mo_2C$ (hex), Mo |
| 7 | $MoO_3$ (s)[b] | 1000 | 20 (57)[e] | 27 (22) | $Mo_2C$ (hex/cub), Mo |
| 8 | $MoO_3$ (s)[b] | 1000 | 10 (85)[e] | 38 (32) | C, $Mo_2C$ (hex) |
| 9 | $MoO_3$ (s)[b] | 625 | 30 (43)[e] | 20 (17) | C, $Mo_2C$ (hex/cub) |
| 10 | $MoO_3$ (s)[b] | 625 | 20 (57)[e] | 27 (22) | C, $Mo_2C$ (hex), $MoO_2$ |
| 11 | $MoO_3$ (s)[b] | 1000 | 50 (28)[e] | 12 (11) | C, $Mo_2C$ (hex/cub) |
| 12 | $MoO_3$ (s)[c] | 800 | 3.5 (100)[e] | 55 (55) | $Mo_2C$ (hex/cub) |

[a]Impregnated powder of aggregates of carbon nanotubes
[b]Impregnated extrudates of aggregates of carbon nanotubes
[c]Powder of aggregates of carbon nanotubes physically mixed with Mo precursor
[e]Calculated $Mo_2C$ loading in final calcined product assuming full conversion of Mo precursor to $Mo_2C$ The chemical reaction involved in the preparation of Samples 1-12 is:

$$2MoO_3 + 7C \rightarrow Mo_2C + 6CO.$$

In the second column is a list of molybdenum precursors converted to $Mo_2C$ by reaction with carbon nanotubes. Moacac refers to molybdenyl acetylacetonate, and $MoO_3$ refers to molybdenum trioxide. "(s)" refers to the solid phase of the molybdenum precursor. Superscripts a, b and c refer to methods of dispersing the reactants as described in Examples 2, 3 and 4, respectively. T° C. refers to the final calcination temperature of the reaction temperature cycle. "C:Mo initial" refers to the atomic ratio of C:Mo in the original reaction mixture before conversion to a carbide compound. For example, the stoichiometric atomic ratio to produce pure carbide with no excess C or Mo, i.e., pure $Mo_2C$ is 3.5. The number following in parentheses is the calculated loading of the $Mo_2C$ contained in the resulting materials. "Weight loss (theor.)" refers to the theoretical weight loss according to the chemical equation. "Phases, XRD" shows the compounds found in the XRD analyses. $Mo_2C$ exists in 2 distinct crystallographic phases, hexagonal and cubic.

Table 2 below summarizes the XRD results for the samples of Table 1.

TABLE 2

SUMMARY OF XRD RESULTS

| Sample | $Mo_2C$ (hex) | $Mo_2C$ (cubic) | $MoO_2$ |
|---|---|---|---|
| MoC | >100 nm | | |
| 1 | 15~20 nm | | minor component |
| 2 | | 5~8 nm | |
| 3 | | 5~8 nm | |
| 4 | 10~15 nm | | |
| 5 | 15~20 nm | ~15 nm | |
| 6 | 20 nm | | |
| 7 | 36~38 nm | | |
| 8 | 8~10 nm | 8~10 nm | |
| 9 | 18 nm | | minor component |
| 10 | 20~25 nm | 5~8 nm | |
| 11 | 35 nm | | |
| 12 | 26 nm | | |

Table 2 summarizes the XRD results for the experiments summarized in Table 1, identifies the compounds made, the phases present and the calculated average particle size for the different phases.

The average particle size is a volume-biased average size, such that the value of one large particle counts more heavily than several medium particles and much more than the volume of many small particles. This is a conventional procedure which is well known to those familiar with XRD methods.

Discussion of Results of Examples 1-7

A. Unsupported $Mo_2C$ Nanoparticles and Nanorods

Samples 1 and 12 provided the clearest evidence of the formation of free-standing $Mo_2C$ nanorods and nanoparticles. These were obtained by reacting stoichiometric or near stoichiometric mixtures of $MoO_3$ and carbon nanotubes, either as powder or as extrudates. Product identification and morphologies were obtained by SEM, HRTEM and XRD. In Example 1, with about 15% excess of carbon, the major product was identified by XRD as the hexagonal phase of $Mo_2C$. $MoO_2$ and graphitic carbon were seen as minor components. SEM showed the presence of both nanorods (approximately 10 to 15 nm in diameter) and nanoparticles (approximately 20 nm).

Figure 1C:
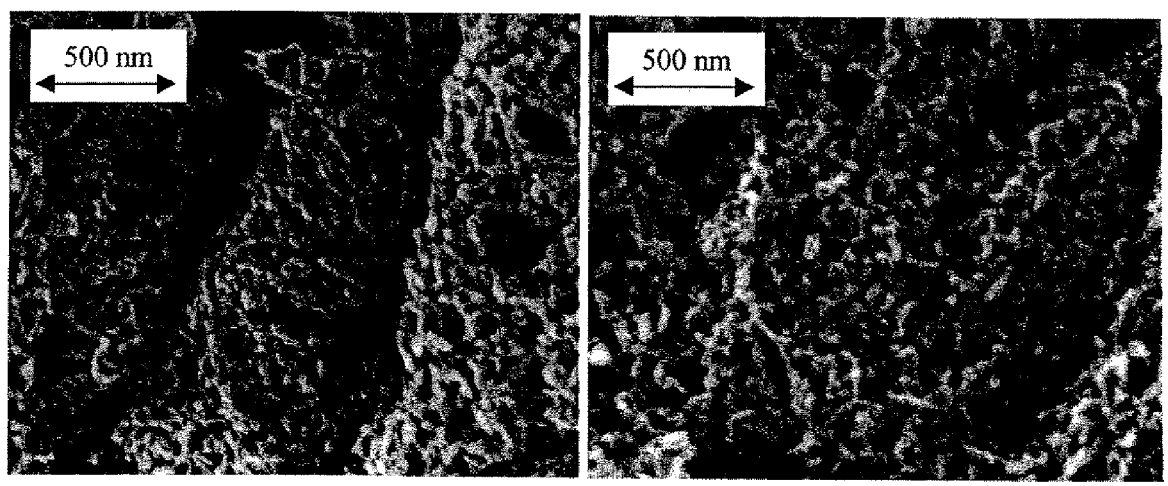

Samples 11 and 12 were obtained by reaction carbon nanotubes with either a stoichiometric mixture of well-dispersed $MoO_3$ powder or with impregnated ammonium molybdate. More evidence of the formation of $Mo_2C$ nanorods and nanoparticles was obtained in Sample 12, obtained by reacting a stoichiometric mixture of $MoO_3$ and powder of carbon nanotubes. XRD, SEM and HRTEM analyses showed formation of both $Mo_2C$ nanorods and nanoparticles. The SEM analyses showed a network of nanorods with nanoparticles distributed within the network as shown in FIG. 1. Accurate dimensions of carbide nanorods have been obtained by HRTEM as shown in FIG. 2, which shows carbide nanorods having diameters similar to those of carbon nanotubes, namely, about 7 nm. The carbide nanoparticles particles ranged from about 7 nm to about 25 nm in diameter.

Sample 12, a stoichiometric mixture, was studied in more detail in order to learn the course of the reaction. The reaction was tracked by thermogravimetric analysis (TGA) as shown in FIG. 4. FIG. 4 shows that the stoichiometric reaction has occurred in two distinct steps, namely, reduction of $MoO_3$ by carbon to $MoO_2$ at from about 450 to about 550° C., followed by further reduction to $Mo_2C$ at from about 675° C. to about 725° C. SEM and XRD analyses taken after calcination at 600° C. showed a complete redistribution of oxide precursor from the very large, supra-micron particles of $MoO_3$ initially present to about 20 to 50 nm particles of $MoO_{3-x}$, well-dispersed amongst individual fibrils. This redistribution probably occurred through vaporization. Further calcination to 800° C. converted the MoO3-x (wherein x is 0 or 1) mixture to $Mo_2C$ nanorods and nanoparticles, with further reduction in particle size from about 7 to about 25 nm. Without being bound by any theory, even though redistribution of $MoO_3$ probably takes place through vaporization, both chemical transformations ($MoO_3 \rightarrow MoO_2$ and $MoO_2 \rightarrow Mo_2C$) by reduction by carbon are believed to occur through solid-solid phase reactions.

B. $Mo_2C$ Nanoparticles Supported on Carbon Nanotubes

Figure 3B:
FIG. 3B is an HRTEM micrograph of sample 10 as shown in Table C.

XRD, SEM and HRTEM analyses of products from Sample 10 provided evidence for the successful preparation of nanoparticles of $Mo_2C$ supported on individual carbon nanotubes. These products were formed by impregnation of ammonium molybdate from aqueous solution onto CC aggregates of carbon nanotubes and carefully calcined as shown in Table 1. XRD's of both products showed the cubic form of $Mo_2C$ to be the major component along with graphitic carbon. Hexagonal $Mo_2C$ was seen as a minor component. No molybdenum oxide was detected. The cubic $Mo_2C$ particles ranged from about 2 to about 5 nm in diameter, while the hexagonal particles ranged from about 10 to about 25 nm. The cubic particles were mainly deposited on individual carbon nanotubes, while the hexagonal particles were distributed between carbon nanotubes. These can be seen in FIGS. 3 and 4, which are copies of HRTEM micrographs taken from Sample 10. In these pictures, the particle size can be estimated by direct comparison with the fibril diameters, which range from 7 to 10 nm.

Example 8

Preparation of Tungsten Carbide Precursors by Impregnation with Ammonium Tungstate The procedure used in Example 2 above was followed, except that the impregnating solution was an aqueous solution containing the correct amount of ammonium paratungstate hydrate (($NH_4$)$_{10}W_{12}O_{41}$·5$H_2O$ 72% W, referred to as ammonium tungstate) necessary for the desired C:W atom ratio loading (C:W mole ratios of 3.5:1, 10:1 and 20:1). The resulting mixture was dried at 225° C. in full vacuum for 18 hours during which the paratungstate compound was decomposed to $WO_3$. The sample was set aside for conversion to carbide catalysts by careful calcination under an inert atmosphere as more particularly described in Example 10.

Example 9

Preparation of Tungsten Carbide Precursors by Impregnation with Phosphotungstic Acid The procedure used in Example 8 above was followed, except that the impregnating solution was an aqueous solution containing the correct amount of phosphotungstic acid ($H_3PO_4$·12 $WO_3$·$xH_2O$, 76.6% W referred to as PTA), necessary for the desired C:W atom ratio loading (C:W mole ratios of 3.5:1, 10:1 and 20:1.) The resulting mixture was dried at 225° C. in full vacuum for 18 hours during which the PTA was decomposed to $WO_3$. The sample was set aside for conversion to carbide catalysts by careful calcination under an inert atmosphere as more particularly described in Example 10.

Example 10

Calcination of Tungsten Carbide Precursors at 1000° C.

The procedure described in Example 7 above was followed to convert precursors of tungsten carbides to tungsten carbides. After cooling in argon, the samples were passivated using 3% $O_2$/Ar. Table 3 below summarizes the experimental conditions and XRD results for selected experiments.

TABLE 3

SUMMARY OF RESULTS FOR TUNGSTEN CARBIDE PREPARATIONS

| SAMPLE | W Source | T° C. | C:W INITIAL | PHASES, XRD |
|---|---|---|---|---|
| 1 | PTA and CC[a] | 1000 | 3.5:1 | WC and $W_2C$ |
| 2 | PTA and CC | 1000 | 10:1 | WC and $W_2C$ |
| 3 | PTA and CC | 1000 | 20:1 | WC and $W_2C$ |
| 4 | A. Tung and CC[b] | 1000 | 3.5:1 | WC, $W_2C$ and possibly W |
| 5 | A. Tung and CC | 1000 | 10:1 | WC and $W_2C$ |
| 6 | A. Tung and CC | 1000 | 20:1 | WC and $W_2C$ |

[a]Impregnated powder of CC aggregates of carbon nanotubes by incipient wetness with phosphotungstic acid
[b]Impregnated powder of CC aggregates of carbon nanotubes by incipient wetness with ammonium paratungstate hydrate The chemical reactions involved in the preparation of Samples 1-6 summarized in table 3 are:

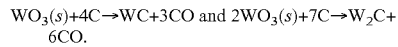

$WO_3(s)+4C \rightarrow WC+3CO$ and $2WO_3(s)+7C \rightarrow W_2C+6CO$.

In the second column of Table 3 is a list of tungsten precursors which were converted to $W_2C$/WC by reacting with carbon nanotubes. PTA refers to phosphotungstic acid and A. Tung refers to ammonium paratungstate hydrate. "(s)" refers to the solid phase of the tungsten precursor. C:W refers to the ratio of C atoms to W atoms in the original mix. The stoichiometric atom ratio to produce pure WC with no excess of C or W is 4.0. To produce pure $W_2C$, the atom ratio C:W is 3.5. The XRD column lists the compounds observed in the XRD analyses.

Examples 11-13

Preparation of a Catalyst Support of Extrudates of Silicon Carbide Nanorods

SiC nanorods were prepared from Hyperion aggregates of carbon nanotubes in accordance with Example 1 of U.S. application Ser. No. 08/414,369 filed Mar. 31, 1995 by reacting the carbon nanotubes with ISO vapor at high temperature. The resulting SiC nanorods have a uniform diameter of fifteen nm on average and a highly crystallized β-SiC structure.

Poly(dimethylsiloxane) as provided by Aldrich Chemicals of Milwaukee, Wis. was used as a binder for the preparation of extrudates of SiC nanorods. 0.16 g of SiC nanorods and 0.16 g of poly(dimethylsiloxane) were mixed to form a uniform thick paste. Subsequently, the paste was pushed through a syringe to produce extrudates having a green color which were heated under flowing argon atmosphere under the following conditions: at 200° C. for 2 hours (Example 11); at 400° C. for 4 hours (Example 12); and at 700° C. for 4 hours (Example 13). A rigid porous structure of SiC nanorods was formed.

Figure 5A:
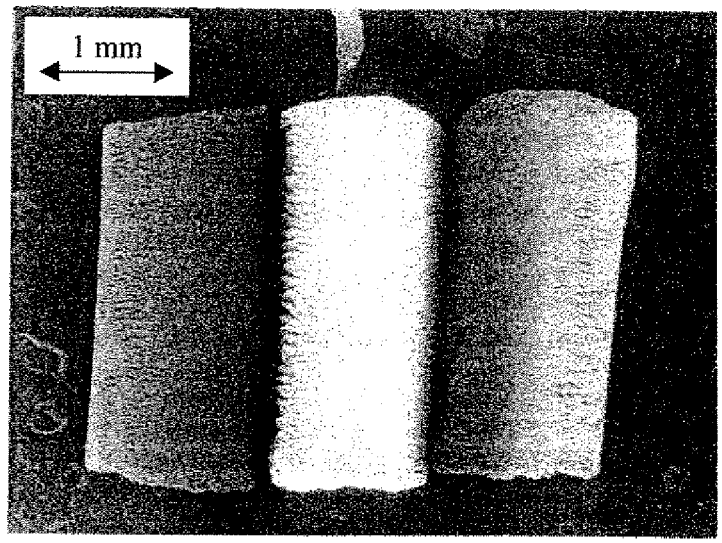
FIG. 5A is an SEM micrograph of SiC extrudates.
Figure 5B:
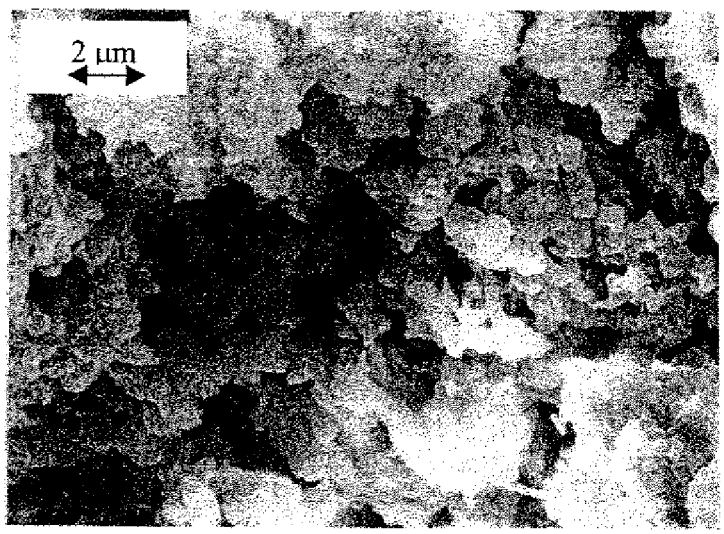
FIG. 5B is an SEM micrograph illustrating micropores among the aggregates of the extrudates shown in FIG. 5A.
Figure 5C:
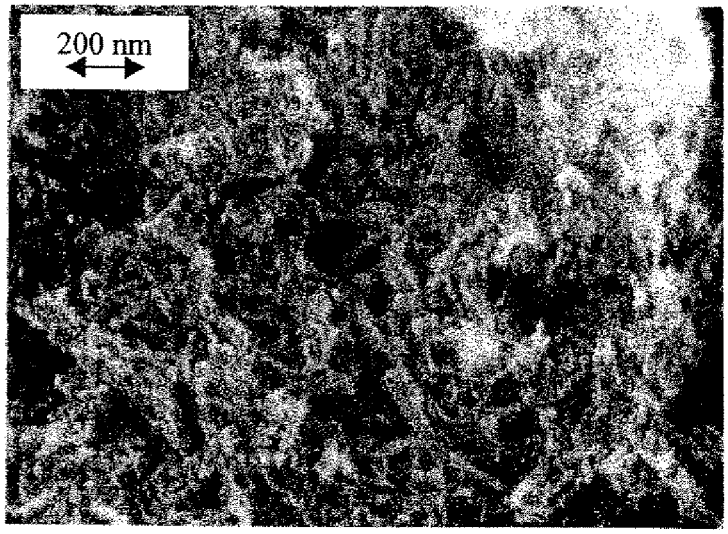
FIG. 5C is an SEM micrograph illustrating micropores in the networks of the intertwined SiC nanorods present in the extrudates shown in FIG. 5A.

The extrudates obtained in Examples 11-13 had a density of 0.97 gm/cc and a bimodal pore structure. The macropores were 1 to 5 μm, as shown in FIG. 5B among aggregates and the mesopores were 10 to 50 nm, as shown in FIG. 5C in the networks of intertwined SiC nanorods. The diameter of the extrudates was about 1.2 nm as shown in FIG. 5A. The specific surface area of the extrudates of SiC nanorods was 97 $m^2$/gm.

Because of their high surface area, unique pore structure and high temperature stability, the SiC extrudates are attractive for various applications, including as supports for catalysts such as platinum, palladium other catalytic metals and carbides of Mo, W, V, Nb or Ta. The surface properties of SiC nanorods when used as a catalyst support are very close to those of carbon. Conventional carbon supports can therefore be replaced with SiC extrudates. Many properties of carbon supported catalysts can be realized in high temperature conditions, as required, in particular, for oxidation reactions.

Examples 14 and 15

Preparation by Reductive Carburization of Extrudates of Carbon Nanotubes Including Molybdenum Carbides Two samples of 5 gms of extrudates of carbon nanotubes having a volatile molybdenum compound on the surface thereof prepared according to Example 14 are charged into alumina boats. Each boat is placed into a tube furnace and heated under flowing argon for 2 hours at 250° C. and 450° C., respectively. The gas is changed from argon to a mixture of $CH_4/H_2$ (20% $CH_4$) and the furnace is slowly (1° C./min) heated up to 650° C. where the temperature is maintained for 1 hour. Molybdenum carbides supported on the surface of the extrudates of the carbon nanotubes are obtained.

Example 16

Preparation by Reactive Chemical Transport of Extrudate of Molybdenum Carbide Nanorods One gram of an extrudate of carbon nanotubes, 8 gms of molybdenum powder and 50 mg of bromine contained in a glass capsule are placed into a quartz tube which is evacuated at $10^{-3}$ Torr and then sealed. After the bromine capsule is broken, the tube is placed into a tube furnace and heated at 1000° C. for about 1 week. The extrudates of carbon nanotubes are substantially converted to molybdenum carbide nanorods.

Example 17

Preparation by Carburization of Molybdenum Carbides Supported on the Surface of Extrudates of Carbon Nanotubes A sample of an extrudate of carbon nanotubes is placed in a vertical reactor such that a bed is formed. The extrudate is heated under flowing $H_2$ gas at 150° C. for 2 hours. Thereafter, the extrudate is cooled to 50° C. $H_2$ gas passed through a saturator containing $Mo(CO)_6$ at 50° C. is passed over the cooled extrudates of carbon nanotubes. As a result, $Mo(CO)_6$ becomes adsorbed on the surface of the extrudate. Following the adsorption of $Mo(CO)_6$, the temperature of the sample is raised to 150° C. in an atmosphere of pure $H_2$. The temperature is maintained at 150° C. for 1 hour. The temperature of the sample is then increased at 650° C. and maintained at this temperature for 2 hours under flowing $H_2$ gas. A sample of the extrudate of carbon having molybdenum on its surfaces is obtained. This sample is kept at 650° C. for 1 hour. The gas is switched from $H_2$ to a $CH_4/H_2$ mixture (20% $CH_4$). The molybdenum adsorbed on the surfaces of the carbon nanotubes is converted to molybdenum carbide. The amount of molybdenum carbide formed on the surface of the extrudate can be controlled, by varying the duration of adsorption of the $Mo(CO)_6$ over the cooled carbon nanotube extrudate.

Example 18

Use of $Mo_2C$ Nanoparticles and/or Nanorods Supported on Aggregates of Carbon Nanotubes in the Vapor Phase Hydrogenation of Ethylene A vapor phase reactor was assembled by inserting a 6 mm quartz thermowell upward through the bottom end of a vertical quartz tube having an outer diameter of 12 mm. A porous plug of quartz wool was placed at the tip of the thermowell to support a bed of catalyst powder. One gram of the catalyst of Sample No. 2 in Table 1 was crushed and sieved to (+80-60) standard mesh and placed onto the quartz wool plug. The tube was placed vertically into a ½ inch tube furnace as described in Example 6. The top of the tube was fitted with gas inlet lines to feed reactant gases, and the bottom of the tube was fitted with an exit line connected to a 0-15 psi pressure gauge. Rotometers in the gas inlet lines controlled the flows and thus the ratios of the individual reactant gases. Product gases were fed through a gas sampling valve to a Varian gas chromatograph equipped with a GS-Q capillary column suitable for analyzing $C_1$-$C_5$ alkanes and olefins.

Ethylene and hydrogen gases were fed to the vapor phase reactor described in molar ratios ranging from 1:1 to 4:1 ethylene:$H_2$ at 70° C. initial temperature, 1-3 psi gauge total pressure at a gas space velocity (GSV) 60-325 min$^{-1}$. In each run, the temperature of the catalyst bed was held at the set temperature of 70° C. for several minutes, and then rapidly increased to approximately 200° C. in several minutes. The temperature of the catalyst bed remained relatively constant thereafter. Analyses by gas chromatography showed 100% conversion of ethylene to ethane. Ethane was the only product observed, i.e., the selectivities of the reaction approached 100%.

Example 19

Preparation of Oxycarbide Containing Nanorods Catalyst In Situ and Use of in the Vapor Phase Isomerization of Butane to Isobutane The catalyst Sample 12 of Table 1 was oxidized to form oxycarbide nanorods. This unsupported catalyst was then used to isomerize butane to isobutane. A 1.0 gram sample of ground catalyst (+80-60) was placed in a reactor as described in Example 18. The catalyst was treated with 10% $H_2$ in argon at 700° C. for 30 minutes, cooled in argon to room temperature, and then treated with 3% $O_2$ in argon at 350° C. for 14 hours to obtain oxycarbide-containing nanorods. After purging the system of $O_2$, mixtures of n-butane and $H_2$ in molar ratios of n-butane:$H_2$ ranging from 1:16 to 1:4 at 1-3 psi gauge pressure were fed to the reactor at a WHSV 1 hr$^{-1}$ to 10 hr$^{-1}$. The products were analyzed by GC using a GS-Q capillary column.

A steady yield of 4.4% isobutane was obtained at 380° C. at a WHSV 2 hr$^{-1}$. Conversion of n-butane was approximately 4.5% with selectivity to isobutane of about 96% based on GC analyses. The byproducts, in order of abundance, were propane, ethane and methane. Increasing the temperature to 420° C. increased the conversion of n-butane to more than 10% isobutane. However, the selectivity to isobutane was less than 50%, with the major selectivity loss to methane.

Example 20

Use of Mo$_2$C Nanoparticles and/or Nanorods Supported on Extrudates of Aggregates of Carbon Nanotubes in the Vapor Phase Hydrogenation of Ethylene A vapor phase reactor is assembled as described in Example 18. One gram of the catalyst Sample No. 9 in Table 1 is crushed and sieved to (+80-60) standard mesh and placed onto the quartz wool plug. The tube is placed vertically into a ½ inch tube furnace as described in Example 5. The top of the tube is fitted with gas inlet lines to feed reactant gases and the bottom of the tube is fitted with an exit line connected to a 0-15 psi pressure gauge. Rotometers in the gas inlet lines control the flows and thus the ratios of the individual reactant gases. Product gases are fed through a gas sampling valve to a Varian gas chromatograph equipped with a GS-Q capillary column.

Ethylene and hydrogen gases are fed to the vapor phase reactor in molar ratios ranging from 1:1 to 4:1 ethylene: H$_2$ at 70° C. initial temperature, 1-3 psi gauge total pressure at a GSV 60-325 min$^{-1}$. In each run, the temperature of the catalyst bed is held at the set temperature of 70° C. for several minutes, then rapidly increased to approximately 200° C. in several minutes. The temperature of the catalyst bed remains relatively constant thereafter. Analyses by GC shows 100% conversion of ethylene to ethane. Ethane is the only product observed, i.e., selectivities approaching 100%.

Example 21

Use of Mo$_2$C Nanoparticles and/or Nanorods Supported on Extrudates of Aggregates of Carbon Nanotubes in the Vapor Phase Isomerization of Butane to Isobutane The catalyst of Sample 11 of Table 1 was oxidized to form oxycarbide nanorods which were used to isomerize butane to isobutane. A 1.0 gram sample of ground catalyst (+80-60) was placed in a reactor as described in Example 18. In the reactor, the catalyst was then treated with 10% H$_2$ in argon at 700° C. for 30 minutes, cooled in argon to room temperature, and then treated with 3% O$_2$ in argon at 350° C. for 14 hours to obtain oxycarbide nanorods. After purging the system of O$_2$, mixtures of n-butane and H$_2$ in molar ratios of n-butane: H$_2$ ranging from 1:16 to 1:4 at 1-3 psi gauge pressure were fed to the reactor at WHSVs ranging from 1 to 10 hr$^{-1}$. The products were analyzed by GC using a GS-Q capillary column provided by J&W of Alltech Associates.

A steady yield of 4.4% isobutane was obtained at 380° C. at a WHSV 2 hr$^{-1}$. Conversion of n-butane was approximately 4.5% with selectivity to isobutane of about 96% based on GC analyses. The byproducts, in order of abundance, were propane, ethane and methane. Increasing temperature to 420° C. increased conversion of n-butane to more than 10%. The selectivity to isobutane was less than 50%, with the major selectivity loss to methane.

Example 22

Use of Mo$_2$C Nanoparticles and/or Nanorods Supported on Aggregates of Carbon Nanotubes in the Hydrodesulfurization of Thiophene 0.1 gm of the catalyst of Sample 2 in Table 1 is charged into a 500 cc stirred autoclave with 300 cc of 1 vol % solution of thiophene in hexadecane. The reactor is charged to 80 atm with H$_2$ and the hydrodesulfurization reaction is carried out at 300° C. One cc samples are withdrawn and analyzed at 5-minute intervals and a pseudo first order rate constant for disappearance of thiophene is determined to be 4.5×10$^{-3}$ L/gm cat-s.

Example 23

Use of Unsupported Oxycarbide Nanorods as Catalyst in the Hydrodesulfurization of Thiophene 0.1 gm of catalyst described in Example 19 above is charged into a 500 cc stirred autoclave with 300 cc of 1 vol % solution of thiophene in hexadecane. The reactor is charged to 80 atm with H$_2$ and the hydrodesulfurization reaction is carried out at 300° C. One cc samples are withdrawn and analyzed at 5 minute intervals and a pseudo first order rate constant for disappearance of thiophene is determined to be 4.5×10$^{-3}$ L/gm cat-s.

Example 24

Use of WC/W$_2$C Nanoparticles and/or Nanorods Supported on Aggregates of Carbon Nanotubes in the Vapor Phase Hydrogenation of Ethylene A vapor phase reactor is assembled as described in Example 18. One gram of the catalyst of Sample 1 in Table 3 is crushed and sieved to (+80-60) standard mesh and placed onto the quartz wool plug. The tube is placed vertically into a ½ inch tube furnace as described in Example 10. The top of the tube is fitted with gas inlet lines to feed reactant gases, and the bottom of the tube is fitted with an exit line connected to a 0-15 psi pressure gauge. Rotometers in the gas inlet lines control the flows and thus the ratios of the individual reactant gases. Product gases are fed through a gas sampling valve to a Varian gas chromatograph equipped with a GS-Q capillary column suitable for analyzing C$_1$-C$_5$ alkanes and olefins.

Ethylene and hydrogen gases are fed to the vapor phase reactor in molar ratios ranging from 1:1 to 4:1 ethylene: H$_2$ at 70° C. initial temperature, 1-3 psi gauge total pressure and at GSVs of 65-325 min$^{-1}$. In each run, the temperature of the catalyst bed is held at the set temperature of 70° C. for several minutes, then it is rapidly increased to approximately 200° C. in several minutes. The temperature of the catalyst bed remains relatively constant thereafter. Analyses by GC shows 100% conversion of ethylene to ethane. Ethane is the only product observed, i.e., the selectivities approach 100%.

Example 25

Preparation of Tungsten Oxycarbide Nanorods Catalyst In Situ and Use of Same in the Vapor Phase Isomerization of Butane to Isobutane The catalyst of Sample 2 of Table 3 is oxidized to form unsupported oxycarbide nanorods which are used to isomerize butane to isobutane. A 1-gram sample of ground catalyst (+80-60) is placed in a reactor as described in Example 24. In the reactor, the catalyst is treated with 10% H$_2$ in argon at 700° C. for 30 minutes, cooled in argon to room temperature, and then treated with 3% O$_2$ in argon at 350° C. for 14 hours to obtain tungsten oxycarbide containing nanorods. After purging the system of O$_2$, mixtures of n-butane and H$_2$ in molar ratios of n-butane:H$_2$ ranging from 1:16 to 1:4 at 1-3 psi gauge pressure are fed to the reactor at WHSVs of 1 to 10 hr$^{-1}$.

The products are analyzed by GC using a GS-Q capillary column as provided by Alltech Associates.

A steady yield of 4.4% isobutane is obtained at 380° C. and at a WHSV of 2 hr$^{-1}$. Conversion of n-butane is approximately 4.5% with selectivity to isobutane of about 96% based on GC analyses. The byproducts, in order of abundance, are propane, ethane and methane. Increasing temperature to 420° C. increases conversion of n-butane to more than 10% isobutane. The selectivity to isobutane is less than 50% with the major selectivity loss to methane.

Example 26

Use of WC/W$_2$C Nanoparticles and/or Nanorods Supported on Aggregates of Carbon Nanotubes in the Hydrodesulfurization of Thiophene 0.1 gram of the catalyst of Sample 1 in Table 3 is charged into a 500 cc stirred autoclave with 300 cc of 1 vol % solution of thiophene in hexadecane. The reactor is charged to 80 atm with H$_2$ and the hydrodesulfurization reaction is carried out at 300° C. One cc samples are withdrawn and analyzed at 5-minute intervals and a pseudo first order rate constant for disappearance of thiophene is determined to be $4.5 \times 10^{-3}$ L/gm cat-s.

Example 27

Use of Unsupported Tungsten Oxycarbide Nanorods as Catalyst in the Hydrodesulfurization of Thiophene 0.1 gram of the catalyst in Example 25 is charged into a 500 cc stirred autoclave with 300 cc of 1 vol % solution of thiophene in hexadecane. The reactor is charged to 80 atm with H$_2$, and the hydrodesulfurization reaction is carried out at 300° C. One cc samples are withdrawn and analyzed at 5-minute intervals and a pseudo first order rate constant for disappearance of thiophene is determined to be $4.5 \times 10^{-3}$ L/gm cat-s.

Example 28

Preparation of a Pd Catalyst Supported on SiC Extrudates

A 5 weight % Pd/SiC extrudate catalyst is prepared by contacting 10.0 gm SiC extrudates prepared in Example 12 with a solution containing 1.455 gms Pd(acetylacetonate)$_2$ (34.7% Pd, obtained from Alfa/Aesar of Ward Hill, Mass.) dissolved in 500 cc toluene. The mixture is stirred lightly for 1 hour, after which the toluene is removed at reduced pressure and 40° C. in a rotary evaporator. The resulting dark brown solids are dried at 80° C. overnight, then calcined at 350° C. in air for 16 hours.

Example 29

Preparation of a Pt Catalyst Supported on SiC Extrudates

A 1 weight % Pt/SiC extrudate catalyst is prepared by contacting 10.0 gms SiC extrudates prepared in Example 12 with a 6 N HCl solution containing 0.174 gram PtCl$_4$ (58% Pt, obtained from Alfa/Aesar). The mixture is stirred lightly for 1 hour after which solvent is removed at reduced pressure and 70° C. in a rotary evaporator. The resulting brown solids are dried at 140° C.

Example 30

Oxidation of CH$_4$ with the Pd/SiC Extrudate Catalyst Prepared in Example 28

Five gms of catalyst prepared in Example 28 are packed into a vertical ½" stainless steel tubular reactor to a height of about 2½". A wad of quartz wool placed atop a ¼" stainless steel thermowell inserted upward from the bottom of the tube supports the catalyst bed. The inlet and outlet of the tube reactor are fitted to allow passage of gas into the reactor, through the catalyst bed and out of the reactor. The effluent gas is analyzed by a gas chromatograph using a Poropak Q column manufactured by Millipore Corp. of Bedford, Mass., which allows quantitative analysis of CH$_4$, CO and CO$_2$. Temperature of the reactor is measured by a thermocouple inserted in the thermowell. The reactor is then placed in a 1" Lindberg furnace to provide heat.

The catalyst is reduced in situ with 5% H$_2$/N$_2$ at 350° C. for 12 hours. After purging residual H$_2$ with N$_2$, at atmospheric pressure, a gas mixture comprising 4% O$_2$/1% CH$_4$/95% N$_2$ is passed over the catalyst bed at 450° C. at a total gas rate of 50 l (stp)/hr. Gas chromatograph analysis shows a conversion of CH$_4$>99 mole % at about 100% selectivity to CO$_2$.

Example 31

Oxidation of CO with the Pt/SiC Extrudate Catalyst Prepared in Example 29

The reactor used in Example 30 is loaded with 5 gms of catalyst. The catalyst is reduced in situ with 5% H$_2$/N$_2$ for 2 hours at 350° C., after which the reactor is purged of H$_2$ by N$_2$. At atmospheric pressure, a gas mixture comprising 5% O$_2$/1% CO and 94% argon is passed over the catalyst at 300° C. at a total gas rate of 40 l (stp)/hr. Gas chromatographic analyses show complete conversion of CO to CO$_2$.

The terms and expressions which have been employed are used as terms of description and not of limitations, and there is no intention in the use of such terms or expressions of excluding any equivalents of the features shown and described as portions thereof, it being recognized that various modifications are possible within the scope of the invention.

Thus, while there had been described what are presently believed to be the preferred embodiments of the present invention, those skilled in the art will appreciate that other and further modifications can be made without departing from the true scope of the invention, and it is intended to include all such modifications and changes as come within the scope of the claims.

The invention claimed is:

1. A method of preparing carbide nanorods comprising the steps of:
    impregnating aggregates of carbon nanotubes with an ethanol solution containing MoO$_2$(C$_5$H$_7$O$_2$)$_2$;
    drying said impregnated aggregates of carbon nanotubes at 110° C. under vacuum to form molybdenum carbide precursors;
    calcining said molybdenum carbide precursors at 600° C. to form carbide nanorods;
    cooling said carbide nanorods in Ar at room temperature; and
    passivating said carbide nanorods with 3% O$_2$/Ar.

* * * * *